United States Patent [19]

Kondo et al.

[11] Patent Number: 5,364,738
[45] Date of Patent: Nov. 15, 1994

[54] LIGHT-SENSITIVE COMPOSITION

[75] Inventors: Shunichi Kondo; Akira Umehara; Yoshimasa Aotani, all of Shizuoka; Tsuguo Yamaoka, Funabashi, all of Japan

[73] Assignee: Fuji Photo Film Co., Ltd., Minami-ashigara, Japan

[21] Appl. No.: 957,034

[22] Filed: Oct. 6, 1992

[30] Foreign Application Priority Data

Oct. 7, 1991 [JP] Japan ................... 3-259431
Oct. 7, 1991 [JP] Japan ................... 3-259433

[51] Int. Cl.$^5$ ............... G03C 1/56; G03C 1/72; G03C 1/73; C08F 2/46
[52] U.S. Cl. ................... 430/283; 430/176; 430/192; 430/270; 430/281; 430/284; 430/288; 430/326; 430/921; 522/25; 522/31
[58] Field of Search ............ 430/270, 281, 283, 284, 430/192, 176, 288, 326, 921; 522/25, 31

[56] References Cited

U.S. PATENT DOCUMENTS

| | | | |
|---|---|---|---|
| 4,247,611 | 1/1981 | Sander et al. | 430/286 |
| 4,248,957 | 2/1981 | Sander et al. | 430/270 |
| 4,250,247 | 2/1981 | Sander et al. | 430/275 |
| 4,603,101 | 7/1986 | Crivello | 430/270 |
| 4,883,740 | 11/1989 | Schwalm et al. | 430/270 |
| 5,069,998 | 12/1991 | Schwalm et al. | 430/270 |
| 5,202,216 | 4/1993 | Aotani et al. | 430/270 |
| 5,217,843 | 6/1993 | Dammel et al. | 430/270 |
| 5,250,385 | 10/1993 | Kondo et al. | 430/284 |

FOREIGN PATENT DOCUMENTS 0006627 1/1980 European Pat. Off.
0042562 12/1981 European Pat. Off.

*Primary Examiner*—John Kight, III
*Assistant Examiner*—P. Hampton-Hightower
*Attorney, Agent, or Firm*—Burns, Doane, Swecker & Mathis

[57] ABSTRACT

A positive-working light-sensitive composition whose solubility in a developer is increased by irradiation of light, which comprises:

(a) a vinyl ether compound having at least one group represented by the following formula (A);

$$CH_2=CH\!-\!\!(O\!-\!R^3)_{\overline{n}}O\!- \qquad (A)$$

wherein $R^3$ represents a linear or branched alkylene group having 1 to 10 carbon atoms and n represents an integer of 0 or 1;

(b) a compound capable of being decomposed by irradiation of an actinic light ray or a radiant ray and releasing an acid; and (c) an alkali-soluble polymer, the light-sensitive composition having high sensitivity to light and permitting the use of light of a wide wavelength range.

15 Claims, No Drawings

LIGHT-SENSITIVE COMPOSITION

BACKGROUND OF THE INVENTION

1. Field of the Invention

The present invention relates to a positive-working light-sensitive composition which can be used for making lithographic printing plates, proof sheets for process printing and diagrams for overhead projectors as well as for forming fine resist patterns during the production of semiconductor integrated circuits.

2. Prior Art

As light-sensitive substances which are used for making a lithographic printing plates and the like and solubilized by irradiation of actinic light rays (so-called positive-working light-sensitive substances), there have been known orthoquinone diazide compounds and, in fact, they have widely been used for making lithographic printing plates and the like. These light-sensitive substances make use of the properties of the orthoquinone diazide compounds that they are decomposed into 5-membered carboxylic acids through the irradiation of actinic light rays and are consequently made alkali-soluble, but the sensitivity thereof is still insufficient. This is because the optochemical sensitization of these compounds is highly dependent upon the kinds thereof and the quantum yield thereof never exceeds 1. Moreover, they can be sensitive only to light in a specific wavelength range and, therefore, they have poor adaptability to a variety of light sources and it is difficult to impart white light safety. Furthermore, they cannot be used in applications in which light having a short wavelength is used for the improvement in resolution of photoresists since they highly absorb light of the Deep-UV region.

Recently, there have been proposed several new positive-working light-sensitive materials which can supersede the orthoquinone diazide compounds. An example thereof is a polymeric compound carrying o-nitrocarbinol ester groups such as disclosed in U.S. Pat. No. 3,849,137. However, this polymeric compound does not exhibit sufficient sensitivity either.

Further, there have also been known positive-working light-sensitive compositions which comprise compounds generating acids by irradiation of light, compounds which are, for instance, hydrolyzed by acids and cause a change of solubility in an alkaline water and optionally other additives such as binder resin. Such compositions are disclosed, for instance, in U.S. Pat. Nos. 3,779,778, 4,101,323, 4,247,611, 4,248,957, 4,250,247 and 4,491,628. However, all of these light-sensitive compositions have low sensitivity, show only a small difference between the solubilities of exposed portions and unexposed portions or provide insufficient patterned shapes of positive images and, therefore, they have not yet been practically used.

SUMMARY OF THE INVENTION

An object of the present invention is to provide a novel positive-working light-sensitive composition which solves the foregoing problems. More specifically, the object of the present invention is to provide a novel positive-working light-sensitive composition which has high sensitivity and is adaptable to light of a wide range of wavelength.

The inventors of this invention have searched for novel positive-working light-sensitive compositions other than the o-quinone diazides, have found out that clear positive images can be obtained by a composition containing an alkali-soluble polymer such as an acrylic resin, a vinyl ether compound having a specific structure and a compound capable of releasing an acid by irradiation of light and thus have completed the present invention.

According to an aspect of the present invention, there is provided a light-sensitive composition comprising:

(a) a vinyl ether compound having at least one group represented by the following formula (A);

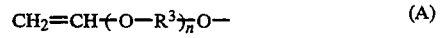

$$CH_2=CH\!-\!(O-R^3)_{\overline{n}}O-\qquad\text{(A)}$$

wherein $R^3$ represents a linear or branched alkylene group having 1 to 10 carbon atoms, preferably represents $-CH_2-$ or $-CH_2CH_2-$ and n represents of 0 or 1;

(b) a compound capable of being decomposed by irradiation of an actinic light ray or a radiant ray and releasing an acid; and (c) an alkali-soluble polymer.

The light-sensitive composition of the present invention is highly sensitive to ultraviolet rays, visible light rays, electron beams and X-rays.

DESCRIPTION OF THE PREFERRED EMBODIMENTS

The groups of the formula (A) are bonded to a carbocyclic or heterocyclic aromatic group or to an aliphatic group. The vinyl compounds having at least one group of the formula (A) must have a boiling point of not less than 60° C.

Preferably, the vinyl ether compounds are those having one or more groups of the formula (A) bonded to an aromatic group directly or through a connecting group selected from the group consisting of $-CO-$, $-CONH-$ and $-(CH_2)_p-NHCONH-$ where p represents an integer of 1 or 2.

Examples of such compounds includes reaction products of an active hydrogen atom-containing vinyl ether compound and an isocyanate group containing compound.

Examples of the compound usable as the component (a) further include those compounds represented by the following formulae (I) or (II).

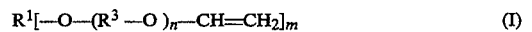

$$R^1[-O-(R^3-O)_n-CH=CH_2]_m \qquad\text{(I)}$$

$$R^2[-CO-O-R^3-O-CH=CH_2]_m \qquad\text{(II)}$$

In the formulae (I) and (II), $R^1$ and $R^2$ each represents an m-valent aliphatic or aromatic group; $R^3$ represents a linear or branched alkylene group having 1 to 10 carbon atoms; n is 0 or 1 and m is an integer of from 2 to 6.

U.S. Pat. No. 4,248,957 discloses positive-working light-sensitive compositions comprising enol ether group-containing compounds analogous to the compounds of the component (a) used in the present invention, but this patent does not disclose compounds carrying vinyl ether groups at all. Moreover, the compounds disclosed in this patent can form positive images, but the sensitivity thereof is insufficient.

The vinyl ether compound which is a reaction product of an active hydrogen atom-containing vinyl ether compound and an isocyanate group-containing compound used in the invention as the component (a) has at least one vinyl ether group and a boiling point as determined at atmospheric pressure of not less than 100° C., includes, for instance, monomers and prepolymers, i.e., oligomers such as dimers and trimers and can be prepared by reacting an active hydrogen atom-containing vinyl ether compound such as those represented by the following general formula (III), (IV) or (V) with an isocyanate group-containing compound:

$$CH_2=CH-O-A-OH \quad (III)$$

$$CH_2=CH-O-A-COOH \quad (IV)$$

$$CH_2=CH-O-A-NH_2 \quad (V)$$

In the above formulae, A represents a linear or branched alkylene group having 1 to 10 carbon atoms.

Examples of the isocyanate group-containing compounds usable in the invention are those disclosed in, for instance, "Handbook of Crosslinking Agents", 1981, issued by Taiseisha Publishing Company, of which disclosures are totally incorporated herein by reference.

Specific examples thereof are polyisocyanate compounds such as triphenylmethane triisocyanate, diphenylmethane diisocyanate, tolylene diisocyanate and dimers of 2,4-tolylene diisocyanate naphthalene-1,5-diisocyanate, o-tolylene diisocyanate, polymethylene polyphenyl isocyanate and hexamethylene diisocyanate; and polyisocyanate adducts such as adducts of tolylene diisocyanate with trimethylolpropane, adducts of hexamethylene diisocyanate with water and adducts of xylene diisocyanate with trimethylolpropane.

Various compounds carrying vinyl ether groups at the ends thereof can be prepared through the reactions of the foregoing isocyanate compounds with the active hydrogen atom-containing vinyl ether compounds.

Specific examples of the vinyl ether group-containing compounds which can be used in the invention will be given below, but the present invention is not restricted to these specific examples.

(a-1)

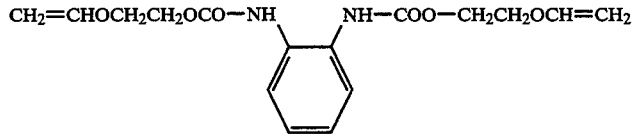
(a-2)

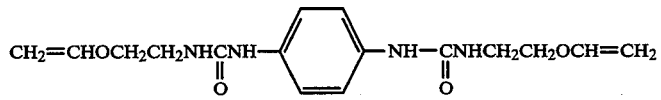
(a-3)

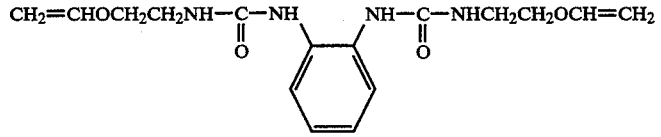
(a-4)

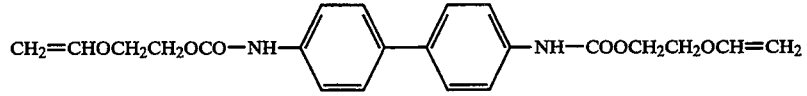
(a-5)

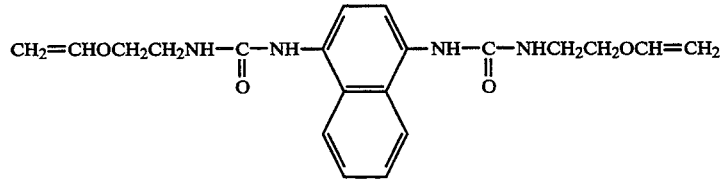
(a-6)

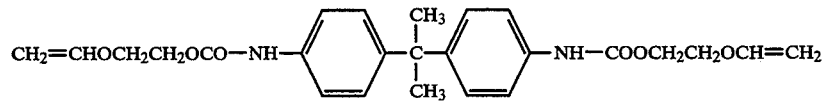
(a-7)

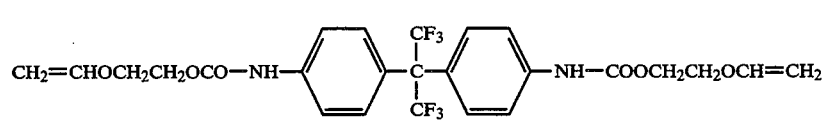
(a-8)

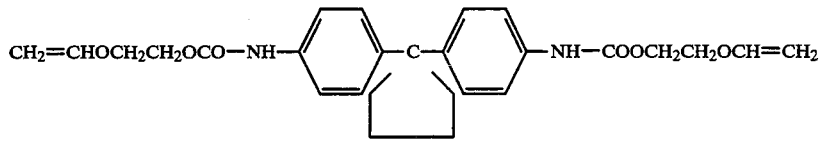
(a-9)

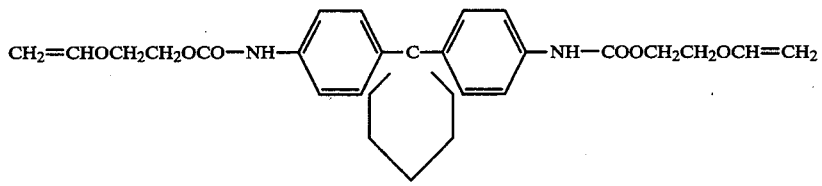
(a-10)

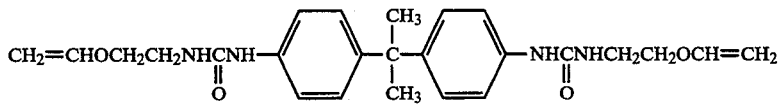
(a-11)

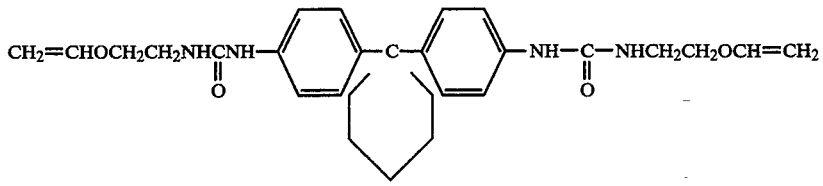
(a-12)

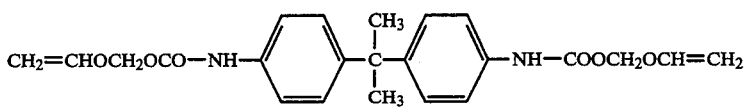
(a-13)

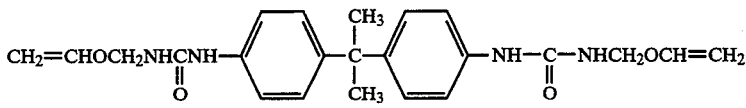
(a-14)

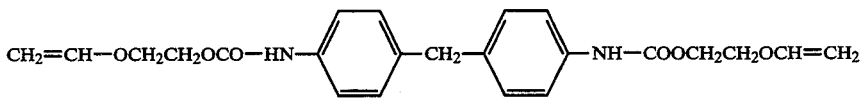
(a-15)

The compounds represented by the formula (I) or (II) used in the present invention as the component (a) have at least one vinyl ether group and a boiling point as determined at atmospheric pressure of not less than 60° C. and includes, for instance, monomers and prepolymers, i.e., oligomers such as dimers and trimers.

The compounds represented by the formula (I) can be prepared by reactions of polyhydric alcohols with acetylene or reactions of polyhydric alcohols with halogenated alkyl vinyl ethers.

Specific examples thereof include ethylene glycol divinyl ether, triethylene glycol divinyl ether, 1,3-butanediol divinyl ether, tetramethylene glycol divinyl ether, neopentyl glycol divinyl ether, trimethylolpropane trivinyl ether, trimethylolethane trivinyl ether, hexanediol divinyl ether, 1,4-cyclohexanediol divinyl ether, tetraethylene glycol divinyl ether, pentaerythritol divinyl ether, pentaerythritol trivinyl ether, pentaerythritol tetravinyl ether, sorbitol tetravinyl ether, sorbitol pentavinyl ether, ethylene glycol diethylene vinyl ether, triethylene glycol diethylene vinyl ether, ethylene glycol dipropylene vinyl ether, triethylene glycol diethylene vinyl ether, trimethylolpropane triethylene vinyl ether, trimethylolpropane diethylene vinyl ether, pentaerythritol diethylene vinyl ether, pentaerythritol triethylene vinyl ether, pentaerythritol tetraethylene vinyl ether, reaction product of bisphenol A with chloromethyl vinyl ether, reaction product of bisphenol A with chloroethyl vinyl ether, reaction product of bisphenol A with acetylene, reaction product of hydroquinone with chloromethyl vinyl ether, reaction product of hydroquinone with chloroethyl vinyl ether, reaction product of hydroquinone with acetylene, reaction product of catechol with chloromethyl vinyl ether and reaction product of catechol with chloroethyl vinyl ether, but the present invention is not limited to these specific compounds.

The compounds of the formula (II) can be prepared by reactions of polycarboxylic acids with halogenated alkyl vinyl ethers.

Specific examples thereof include terephthalic acid diethylene vinyl ether, phthalic acid diethylene vinyl ether, isophthalic acid diethylene vinyl ether, phthalic acid dipropylene vinyl ether, terephthalic acid dipropylene vinyl ether, isophthalic acid dipropylene vinyl ether, maleic acid diethylene vinyl ether, fumaric acid diethylene vinyl ether and itaconic acid diethylene vinyl ether, but the present invention is not limited to these specific compounds.

Among these vinyl ether compounds, the compounds represented by the following general formula (VI) can form particularly clear positive images:

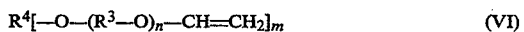

wherein $R^4$ represents an m-valent carbocyclic or heterocyclic aromatic group; $R^3$ represents a linear or branched alkylene group having 1 to 10 carbon atoms, preferably represents —$CH_2$— or —$CH_2CH_2$—; n is 0 or 1 and m is an integer of from 2 to 6.

The aromatic groups contained in the compounds of the formula (VI) include those obtained from compounds composed only of aromatic nucleus or nuclei such as benzene, naphthalene, biphenyl, furan, thiophene, pyrrole, imidazole and carbazole by eliminating m hydrogen atoms therefrom as well as those obtained from compounds containing two or more of aromatic nuclei such as those mentioned above connected with, for instance, an aliphatic hydrocarbon bridging group, —O—, —CO—, —S— or —$SO_2$— such as 2,2-diphenylpropane, 1,1-dip henylcyclopentane, 1,1-diphenylcyclohexane, benzophenone, diphenyl ether, diphenyl sulfide, diphenyl sulfone, 2,2-diphenylhexafluoropropane and triphenylpropane by eliminating m hydrogen atoms therefrom.

Specific examples of the compounds of the formula (VI) used in the invention will be given below, but the present invention is by no means limited to these specific compounds.

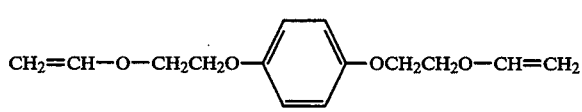

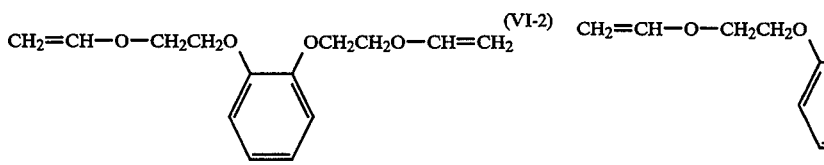
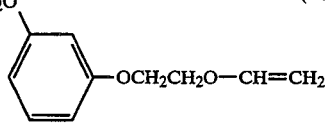

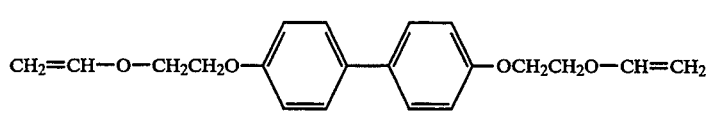

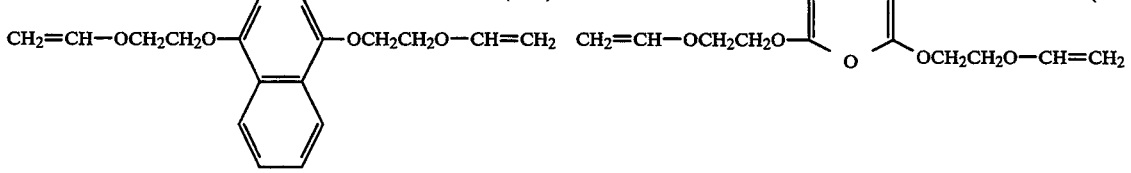

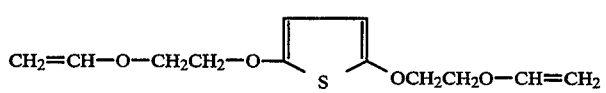

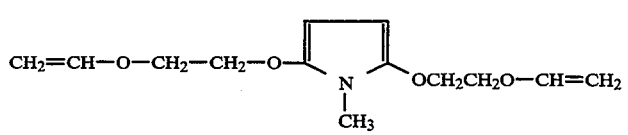

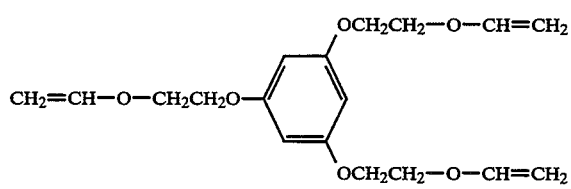

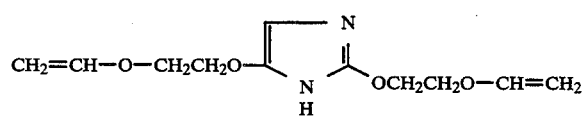

-continued
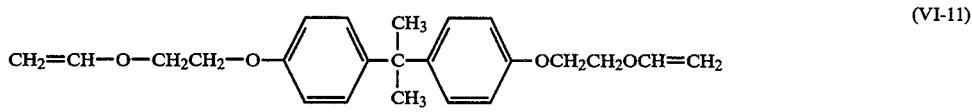 (VI-11)
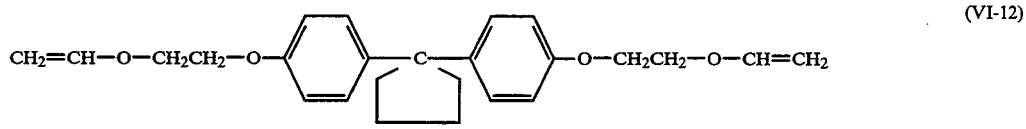 (VI-12)
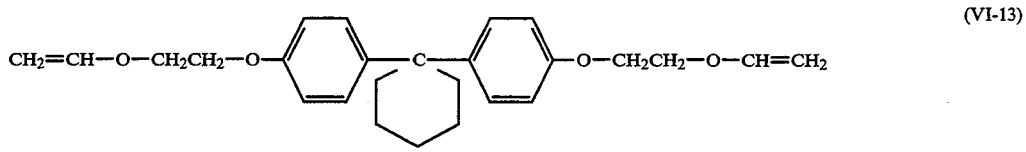 (VI-13)
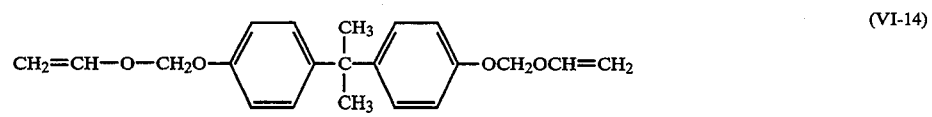 (VI-14)
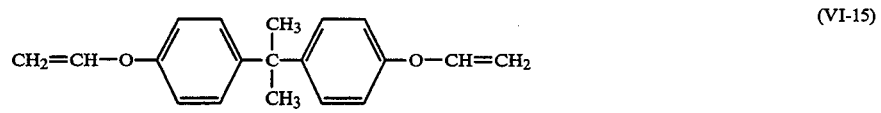 (VI-15)
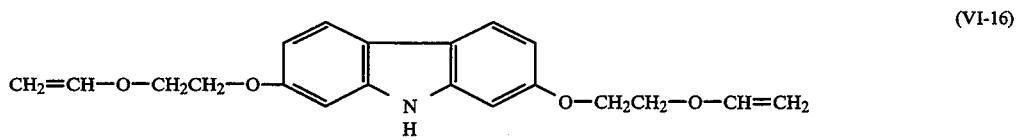 (VI-16)
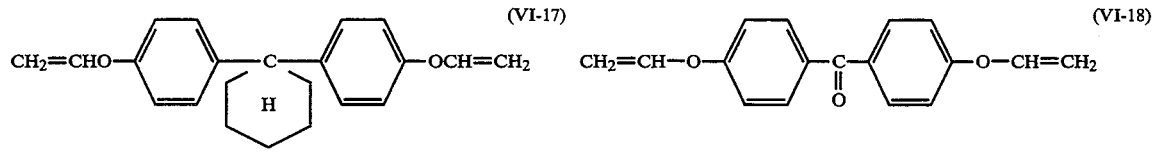
(VI-17) (VI-18)
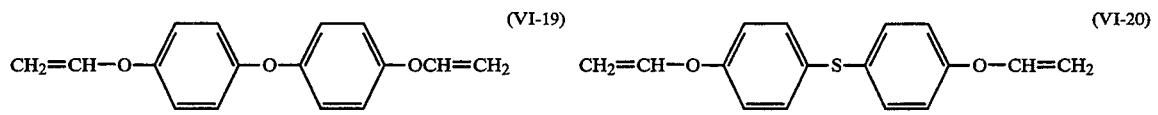
(VI-19) (VI-20)
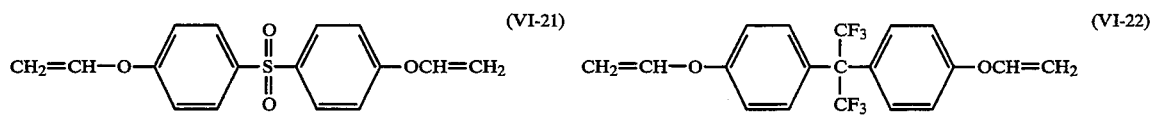
(VI-21) (VI-22)
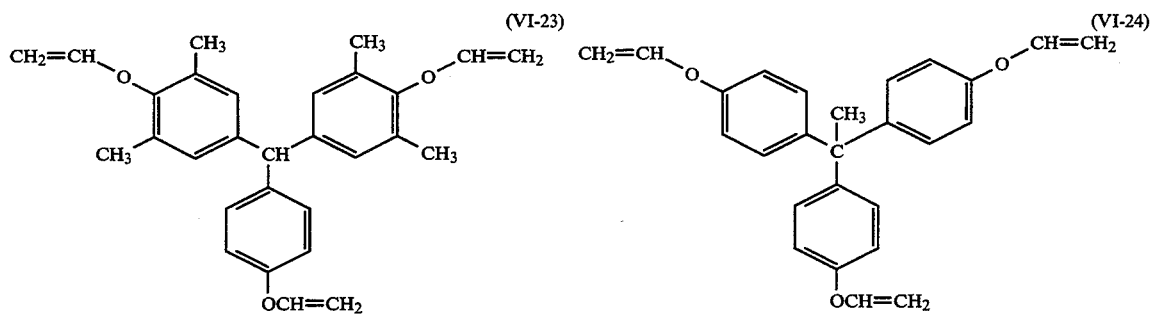
(VI-23) (VI-24)

-continued
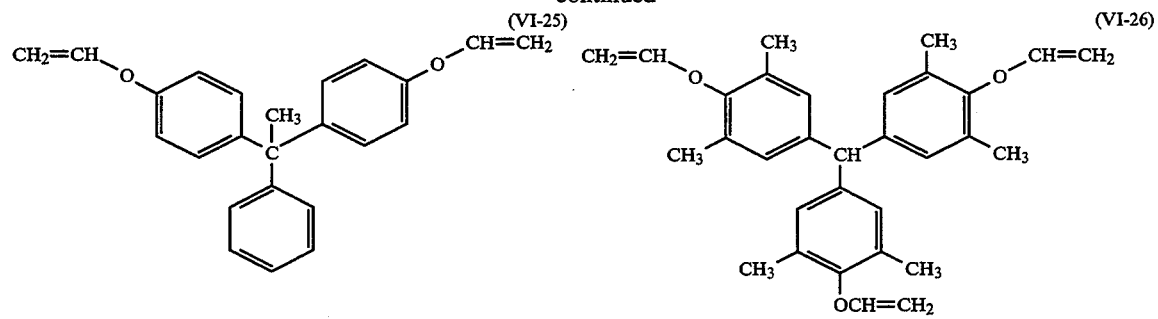
(VI-25)
(VI-26)
(VI-27)
(VI-28)
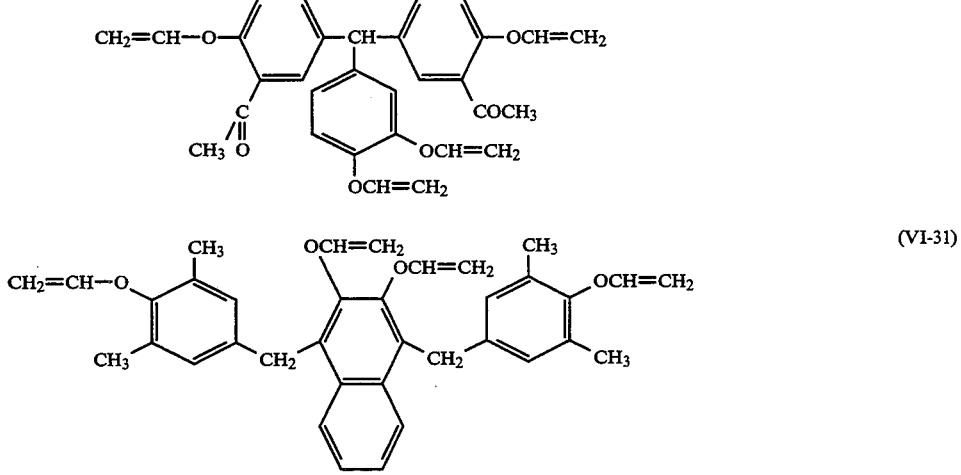
(VI-29)
(VI-30)
(VI-31)

-continued
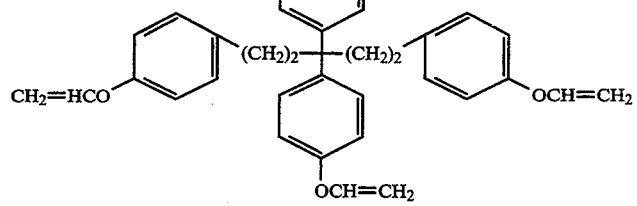 (VI-32)
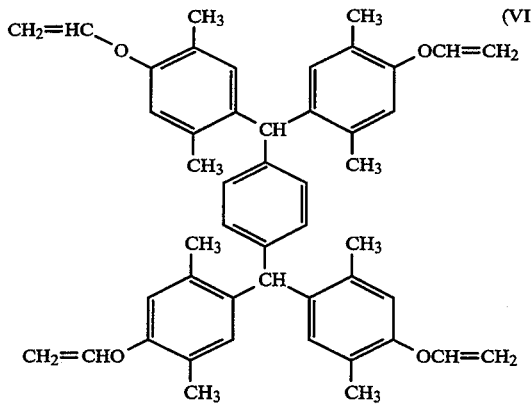 (VI-33)
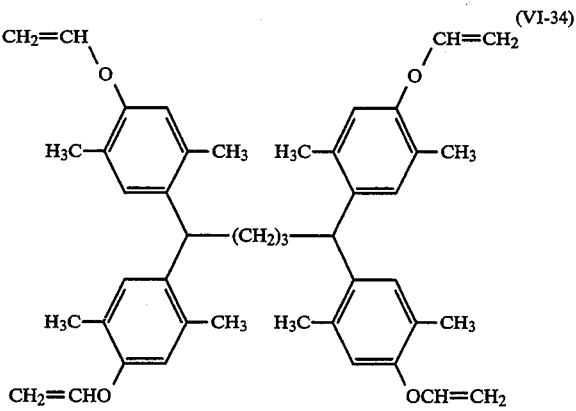 (VI-34)
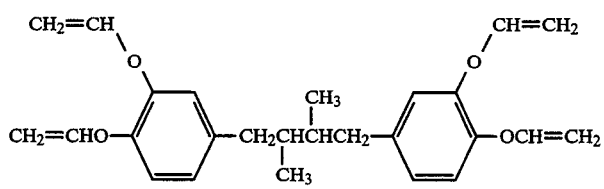 (VI-35)
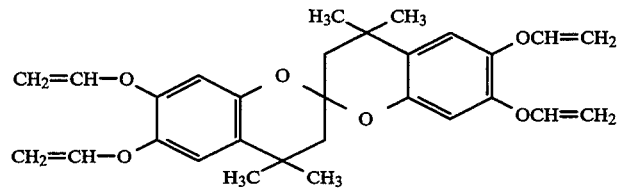 (VI-36)
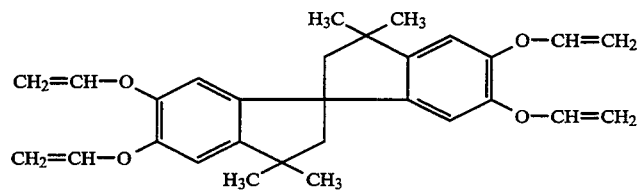 (VI-37)
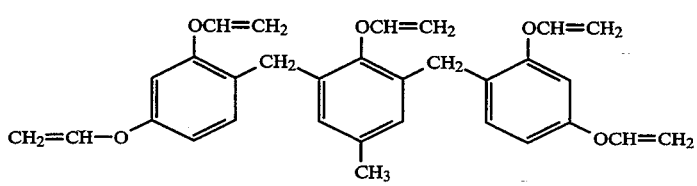 (VI-38)
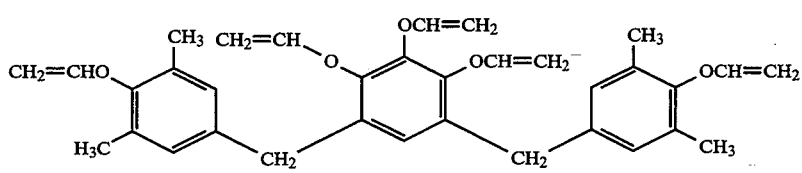 (VI-39)

-continued

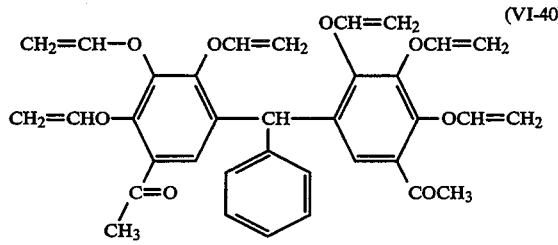
(VI-40)

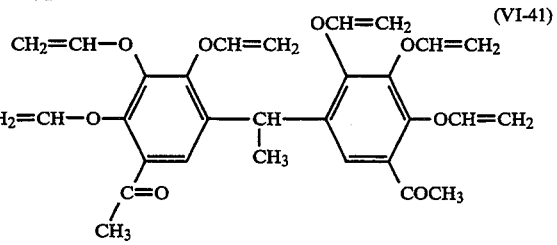
(VI-41)

The vinyl ether compounds may be used, as the component (a), alone or in combination. The light-sensitive composition of the invention preferably comprises the vinyl ether compound in an amount of from 1 to 80% by weight and more preferably from 5 to 50% by weight on the basis of the total weight of the solid contents of the composition.

The vinyl ether compounds used in the invention can be prepared by, for instance, the method disclosed in Stephen C. Lapin, Polymers Paint Colour Journal, 179 (4237) (1989) p. 321.

The compound of the component (b), i.e., the compound capable of being decomposed by irradiation of actinic light rays or radiant rays and releasing an acid (photolytically acid-generating agents) used in the present invention will now be detailed below.

The photolytically acid-generating agent used in the invention may be any compound so far as it can release an acid by irradiation with actinic light rays or radiant rays.

Examples thereof include onium salts such as diazonium salts, iodonium salts, bromonium salts, chloronium salts. sulfonium salts, selenonium salts, pyrylium salts, thiapyrylium salts and pyridinium salts; halogenated compounds such as tris(trihalomethyl)-s-triazine; and sulfonylimide compounds, but preferred are iodonium salts and sulfonium salts. Inter alia, the iodonium and sulfonium salts represented by the following general formula (1) or (2) whose counterions are aromatic sulfonate residues can effectively be used since they can be made sensitive to various light sources by variously changing structures of the counterions:

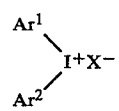
(1)

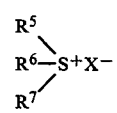
(2)

In the formulae above, $Ar^1$ and $Ar^2$ may be the same or different and each represents a substituted or unsubstituted aryl group. Preferred substituents for these groups $Ar^1$ and $Ar^2$ include alkyl, haloalkyl, cycloalkyl, aryl, alkoxy, nitro, carboxyl, alkoxycarbonyl, hydroxyl, mercapto groups and halogen atoms, with alkyl groups having 1 to 8 carbon atoms, alkoxy groups having 1 to 8 carbon atoms, nitro group and chlorine atom being more preferred.

$R^5$, $R^6$ and R7 may be the same or different and each represents a substituted or unsubstituted alkyl or aryl group. Preferred are aryl groups having 6 to 14 carbon atoms, alkyl groups having 1 to 8 carbon atoms and substituted derivatives thereof. Preferred substituents for these groups $R^5$, $R^6$ and $R^7$ include alkyl groups having 1 to 8 carbon atoms, alkoxy groups having 1 to 8 carbon atoms, nitro group, carboxyl group, hydroxyl group and halogen atoms for the aryl group, and alkoxy groups having 1 to 8 carbon atoms, carboxyl group and alkoxycarbonyl groups for the alkyl group.

Moreover, two of $R^5$ $R^6$ and $R^7$ as well as $Ar^1$ and $Ar^2$ may be bonded together through a single bond or a substituent to form a ring.

$X^-$ represents an anion (counterion) and specific examples thereof include anions of halogen atoms, $BF_4^-$, $BCl_4^-$, $ZrCl_5^-$, $SbCl_6^-$, $FeCl_4^-$, $GaCl_4^-$, $GaBr_4^-$, $AlI_4^-$, $AlCl_4^-$, $SbF_6^-$, $CF_3SO_3^-$, $PF_6^-$, $BPh_4^-$ (Ph represents a phenyl group) condensed polynucleic aromatic sulfonate anions such as naphthalene-1-sulfonate and anthracene-1-sulfonate anions, anthraquinonesulfonate anion, anthracenesulfonate anion and anions derived from sulfonate residue-containing dyes, but the present invention is not restricted to these specific examples.

Specific examples of the compounds represented by the general formula (1) will be given below.

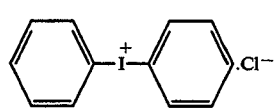
(1-1)

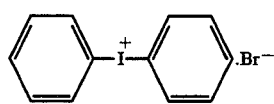
(1-2)

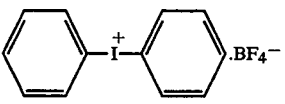
(1-3)

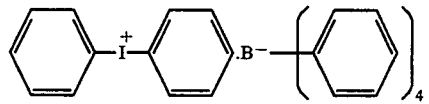
(1-4)

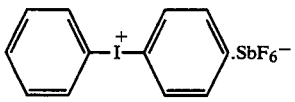
(1-5)

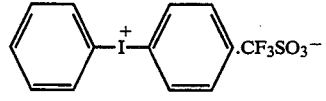
(1-6)

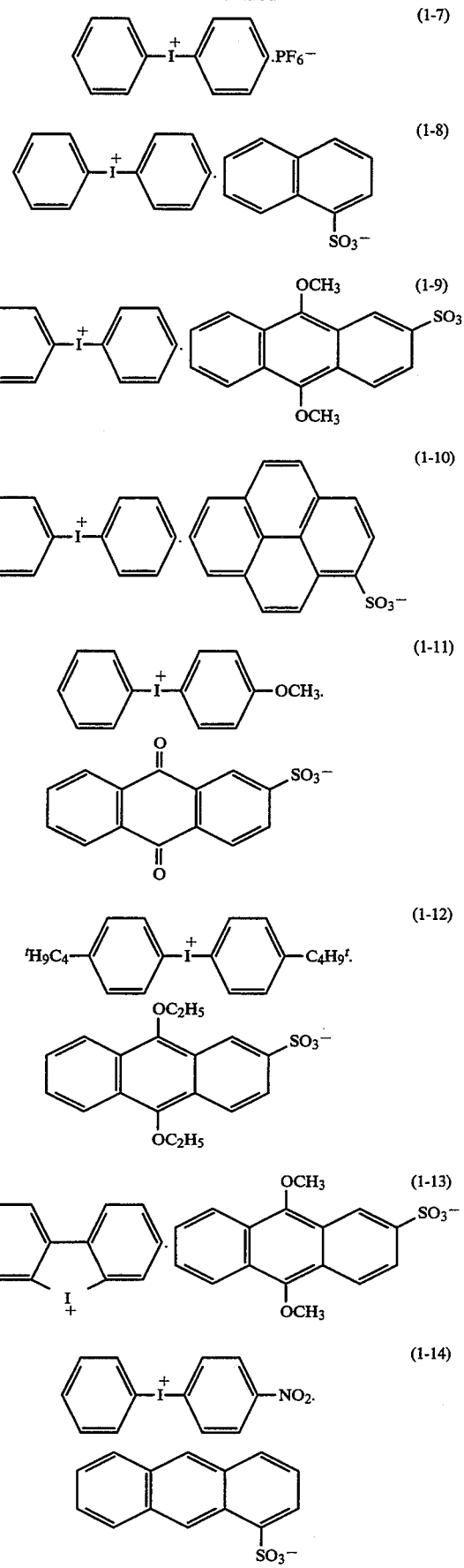
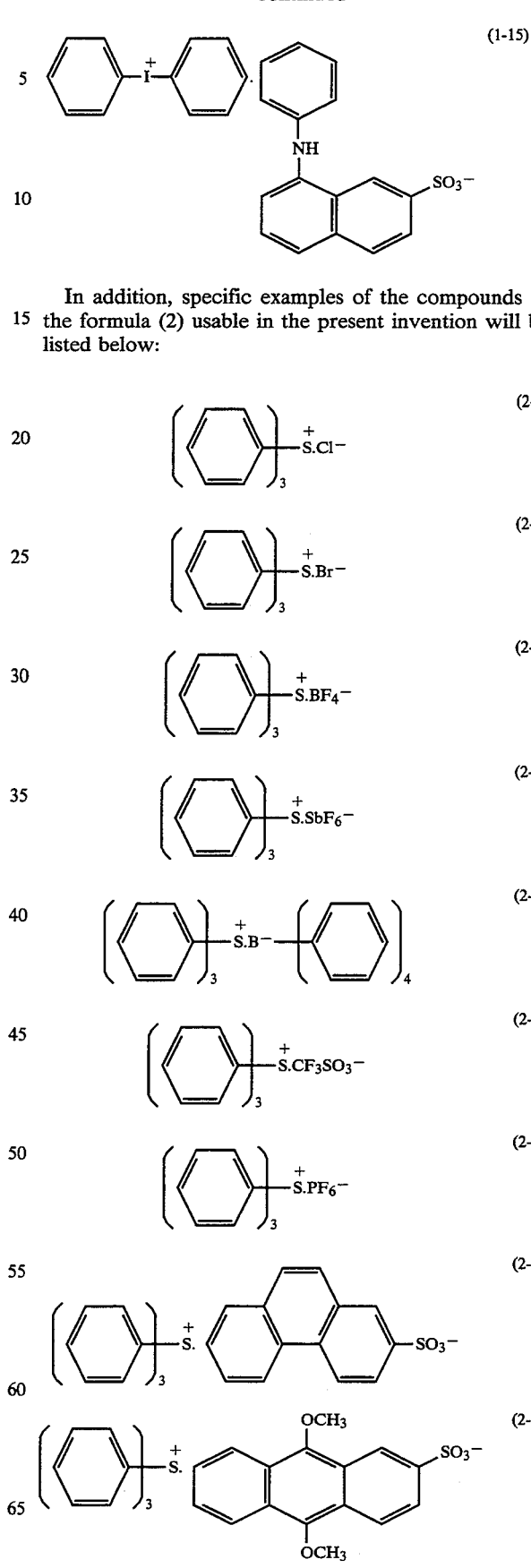
In addition, specific examples of the compounds of the formula (2) usable in the present invention will be listed below:

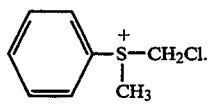
(2-10)
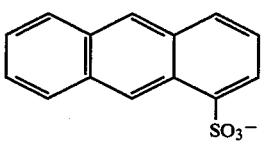

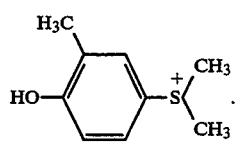
(2-11)
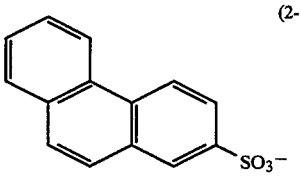

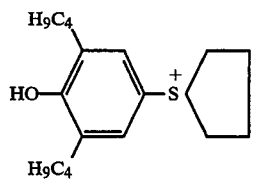
(2-12)
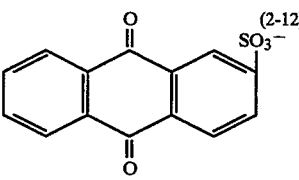

In the light-sensitive composition of the invention, the amount of these onium compounds preferably ranges from 0.01 to 50 parts by weight, more preferably 0.1 to 20 parts by weight per 100 parts by weight of the vinyl ether compound of the component (a) used.

The foregoing compounds represented by the general formulae (1) and (2) can be prepared according to the procedures disclosed in, for instance, J. W. Knapczyk et al., J. Am. Chem. Soc., 91 (1969) p. 145; A. L. Myacock et al., J. Org. Chem., 35 (1970) p. 2532; E. Goethals et al., Bull. Soc. Chem. Belg., 73 (1964) p. 546; H. M. Leicester, J. Am. Chem. Soc., 51 (1929) p. 3587; J. V. Crivello et al., J. Polym. Soc. Polym. Chem. Ed., 18 (1980) p. 2677; U.S. Pat. Nos. 2,807,648 and 4,247,473; F. M. Beringer et al., J. Am. Chem. Soc., 75 (1953) p. 2705; Japanese Patent Unexamined Publication (hereinafter referred to as "J.P. KOKAI") No. Sho 53-101331, of which disclosures are totally incorporated herein by reference.

The alkali-soluble polymer of the component (c) used in the present invention is preferably a polymer carrying acidic groups having pKa values of not more than 11 such as phenolic hydroxyl, carboxyl, sulfonate, imido, sulfonamido, N-sulfonylamido, N-sulfonylurethane and active methylene groups. Preferred alkali-soluble polymers include novolak type phenol resins such as phenol/formaldehyde resin, o-cresol/formaldehyde resin, m-cresol/formaldehyde resin, p-cresol/formaldehyde resin, xylenol/formaldehyde resin and co-condensates thereof. It is also possible to use condensates of phenol or cresol substituted by an alkyl group having 3 to 8 carbon atoms with formaldehyde such as t-butyl-phenol/formaldehyde resin in combination with the foregoing phenol resins as disclosed in J.P. KOKAI No. Sho 50-125806. The alkali-soluble polymers usable in the present invention further include polymers comprising copolymerized units derived from phenolic hydroxyl group-containing monomers such as N-(4-hydroxyphenyl)methacrylamide; homopolymers and copolymers of p-hydroxystyrene, o-hydroxystyrene, m-isopropenylphenol and p-isopropenylphenol; and these polymers which are partially etherified or esterified.

Preferred polymers further include those comprising copolymerized units derived from carboxyl group-containing monomers such as (meth)acrylic acids; carboxyl group-containing polyvinyl acetal resins disclosed in J.P. KOKAI No. Sho 61-267042; and carboxyl group-containing polyurethane resins disclosed in J.P. KOKAI No. Sho 63-124047.

Examples of alkali-soluble polymers usable in the present invention likewise include polymers comprising copolymerized units derived from N-(4-sulfamoylphenyl)methacrylamide, N-phenylsulfonyl methacrylamide and maleimide; and active methylene group-containing polymers disclosed in J.P. KOKAI No. Sho 63-127237.

These alkali-soluble polymers may be used alone or in combination. The light-sensitive composition of the invention may comprise these alkali-soluble polymers in an amount of preferably from 10 to 90% by weight, more preferably from 30 to 80% by weight on the basis of the total weight of the solid content of the composition.

The positive-working light-sensitive composition of the present invention may further comprise, as optional components, compounds capable of improving the photolytically acid-generating efficiency of the foregoing acid-generating compounds (sensitizers), dyes, pigments, plasticizers and various kinds of known compounds for controlling the solubility of the composition in an alkaline aqueous solution.

Examples of the sensitizer are electron-donating compounds such as pyrene and perillene and merocyanine and cyanine dyes, but the present invention is not limited to these specific compounds.

The relative ratio of these sensitizers to the foregoing component (b) preferably ranges from 0.01/1 to 20/1 expressed in terms of molar ratio and 0.1/1 to 5/1 expressed in terms of weight ratio.

In the positive-working light-sensitive composition of the present invention, dyes may be used as coloring agents. Preferred examples thereof include oil-soluble dyes and basic dyes. Specific examples thereof include Oil Yellow #101, Oil Yellow #130, Oil Pink #312, Oil Green BG, Oil Blue BOS, Oil Black BY, Oil Black BS, Oil Black T-505 (all of these dyes being available from Orient Chemical Industries, Co., Ltd.); Crystal Violet (CI 42555), Methyl Violet (CI 42535), Rhodamine B (CI 45170B), Malachite Green (CI 42000) and Methylene Blue (CI 52015).

These dyes may be used alone or in combination and the amount thereof used in the composition ranges from 0.01 to 10% by weight, preferably 0.1 to 3% by weight on the basis of the total weight of the solid contents of the composition, The compounds used in the invention for controlling the solubility of the composition in an alkaline aqueous solution may be, for instance, cyclic acid anhydrides and other fillers.

Specific examples of cyclic acid anhydride include phthalic anhydride, tetrahydrophthalic anhydride, hexahydrophthalic anhydride, 3,6-endoxy-tetrahydrophthalic anhydride, tetrachlorophthalic anhydride, maleic anhydride, chloromaleic anhydride, α-phenylmaleic anhydride, succinic anhydride and pyromellitic anhydride. These cyclic acid anhydrides may be used in an amount preferably ranging from 1 to 15% by weight on the basis of the total weight of the solid contents of the composition and thus the sensitivity of the composition can be increased by about 3 times at most.

In order to increase the difference between the solubilities of exposed portions and unexposed portions, the light-sensitive composition of the invention may further comprise compounds which are hydrolyzed by acids and thus converted into alkali-soluble compounds such as those disclosed in J. P. KOKAI Nos. Sho 62-27829, Sho 63-139343, Sho 64-57258, Hei 1-106038, EP-A-0284868, U.S. Pat. Nos. 3,779,778, 4,101,323, 4,247,611, 4,250,247 and 4,491,628.

When the positive-working light-sensitive composition of the invention is used as a material for making a lithographic printing plate, the foregoing components are dissolved in a solvent to give a coating solution and then applied onto a substrate. When it is used as a resist material for processing semiconductor or the like, a solution obtained by dissolving the foregoing components in a solvent can be used as such. In this respect, solvents usable are, for instance, ethylene dichloride, cyclohexanone, methyl ethyl ketone, methanol, ethanol, propanol, ethylene glycol monomethyl ether, 1-methoxy2-propanol, ethylene glycol monoethyl ether, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethyl sulfoxide, sulfolane, γ-butyrolactone, toluene, ethyl acetate and mixture thereof. The concentration of the foregoing components (whole solid contents inclusive of additives) in the solvent preferably ranges from 2 to 50% by weight. The amount of the light-sensitive composition to be coated may vary depending on specific applications, and it preferably ranges from, expressed in terms of the weight of the solid contents, 0. 5 to 3.0 g/m² for presensitized plate for use in making a lithographic printing plate (hereinafter referred to as "PS plate") and 0.1 to 3.0 g/m² for photoresist. The lower the coated amount of the light-sensitive composition, the higher the sensitivity of the resulting coated film, but the lower the film properties of the light-sensitive film.

The positive-working light-sensitive composition is applied onto a substrate to give a presensitized plate for use in making a lithographic printing plate. In this respect, substrate usable include, for instance, paper; paper laminated with a plastic film (for instance, a polyethylene, polypropylene or polystyrene film); a metal plate such as an aluminum (inclusive of alloys thereof), zinc or copper plate; a plastic film such as a cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate or polyvinyl acetal film; paper or a plastic film which is laminated with a sheet of the foregoing metal or on which the foregoing metal is vapor-deposited. Among these substrates, aluminum plates are particularly preferred because of very high dimensional stability and cheapness thereof. Preferred examples of the substrate further include composite sheets comprising polyethylene terephthalate films to which aluminum sheets are bonded such as disclosed in Japanese Patent Publication (hereinafter referred to as "J. P. KOKOKU") No. Sho 48-18327.

Substrates having aluminum surfaces are preferably subjected to a surface-graining treatment, for instance, mechanical surface-graining such as wire brush graining, brush graining in which the surface is rubbed with a nylon brush while pouring a slurry of an abrasive on the surface, ball graining, graining by liquid honing or buff graining; chemical graining which makes use of an etchant such as HF, AlCl₃ or HCl; electrolytic graining using nitric acid or hydrochloric acid as an electrolyte; or composite graining comprising any combination of the foregoing surface graining treatments, followed by optional etching with an alkali or an acid and anodization in an electrolyte of sulfuric acid, boric acid, chromic acid, sulfamic acid or mixture thereof using a DC or AC current source to form strong passivation layers on the aluminum surfaces. The aluminum surface is hydrophilized by the formation of such a passivation layer, but preferably the surface is further hydrophilized by, for example, the silicate treatment (sodium silicate, potassium silicate) disclosed in U.S. Pat. Nos. 2,714,066 and 3,181,461; the treatment with potassium fluorozirconate disclosed in U.S. Pat. No. 2,946,638; the phosphomolybdate treatment disclosed in U.S. Pat. No. 3,201,247; the alkyl titanate treatment disclosed in British Patent No. 1,108,559; the treatment with polyacrylic acid disclosed in German Patent No. 1,091,443; the treatment with polyvinylphosphonic acid disclosed in German Patent No. 1,134,093 and British Patent No. 1,230,447; the phosphonic acid treatment disclosed in J.P. KOKOKU No. Sho 44-6409; the phytic acid treatment as disclosed in U.S. Pat. No. 3,307,951; application of an underlying coating of a complex comprising a hydrophilic organic polymer and divalent metal ions disclosed in J.P. KOKAI Nos. Sho 58-16893 and Sho 58-16291; and/or hydrophilization by application of an underlying coating of a water-soluble sulfonate residue-containing polymer disclosed in J. P. KOKAI No. Sho 59-101651. Other hydrophilization treatments usable in the invention include silicate electrodeposition treatments as disclosed in U.S. Pat. No. 3,658,662.

The aluminum substrate is preferably subjected to a sealing treatment after the surface-graining and anodization treatments. The sealing treatment can be performed by dipping the substrate in hot water or a hot aqueous solution containing an inorganic or organic salt or exposing the substrate to water vapor.

When the positive-working light-sensitive composition of the invention is used as a photoresist material, substrates of a variety of materials such as a copper plate, a copper-plated substrate, a silicon plate, a stainless steel plate and a glass plate can be used as supports.

The positive-working light-sensitive composition of the present invention can be applied onto the foregoing substrates through various known coating methods such as whirler coating, wire bar coating, dip coating, air-knife coating, roll coating, blade coating, curtain coating and spray coating methods.

The positive-working light-sensitive composition thus applied onto the surface of a substrate is dried at a temperature ranging from 40° to 150° for 30 seconds to 10 minutes using a hot-air dryer or an infrared dryer.

PS plates, photoresist and the like comprising the positive-working light-sensitive composition of the invention are in general imagewise exposed to light and then developed.

Examples of light sources for actinic light rays used in the imagewise exposure of the foregoing materials include mercury lamps, metal halide lamps, xenon lamps, chemical lamps and carbon arc lamps. Examples of radiant rays usable are electron beams, X-rays, ion beams and ultraviolet rays. Light sources preferably used in the imagewise exposure of photoresists include, for instance, those emitting g-rays, i-rays and Deep-UV rays. In the present invention, it is also possible to use the scanning exposure method using a high density energy beam (laser beam or electron beam). Laser beam sources usable include, for instance, a helium/neon laser, an argon laser, a krypton laser, a helium/cadmium laser and KrF excimer laser.

Developers used for developing the positive-working light-sensitive composition of the invention are preferably aqueous solutions containing inorganic alkaline agents such as sodium silicate, potassium silicate, sodium hydroxide, potassium hydroxide, lithium hydroxide, sodium tertiary phosphate, sodium secondary phosphate, ammonium tertiary phosphate, ammonium secondary phosphate, sodium metasilicate, sodium bicarbonate and aqueous ammonia and organic alkaline agents such as tetraalkylammonium hydrides. The concentration of these alkaline agents in general ranges from 0.1 to 10% by weight and preferably 0.5 to 5% by weight.

These aqueous alkaline solutions may optionally comprise surfactants and/or organic solvents such as alcohols.

The positive-working light-sensitive composition of the present invention has high sensitivity to light and permits the use of light of a wide wavelength range.

EXAMPLES

The positive-working light-sensitive composition of the present invention will hereinafter be explained in more detail with reference to the following non-limitative working Examples.

EXAMPLES 1 to 10

A 2S aluminum plate having a thickness of 0.24 mm was degreased by dipping it in a 10% aqueous solution of sodium tertiary phosphate maintained at 80° for 3 minutes, subjected to surface-graining with a nylon brush, followed by etching with sodium aluminate for about 10 minutes and desmutting with a 3% aqueous solution of sodium hydrogen sulfate. Then the aluminum plate was anodized for 2 minutes at a current density of 2 A/dm$^2$ in a 20% sulfuric acid solution.

Then 10 kinds of light-sensitive solutions (A)-1 to (A)-10 having the following formulations were prepared using compounds listed in the following Table 1. These light-sensitive solutions each was applied onto the anodized aluminum plate and then dried at 100° C. for 2 minutes to give each corresponding PS plate. The coated amount of each light-sensitive solution was adjusted to 1.5 g/m$^2$ (weighed after drying).

| Light-Sensitive Solution: Formulation (A) | |
|---|---|
| Alkali-soluble resin listed in Table 1 | 0.2 g |
| Vinyl ether compound listed in Table 1 | 0.08 g |
| Photolytically acid-generating agent listed in Table 1 (acid generator) | 0.002 g |
| Dioxane | 1.5 g |
| Methanol | 0.75 g |

A gray scale having a density difference of 0.15 was brought into close contact with the light-sensitive layer of the resulting PS plate and the resulting assembly was exposed to light from a 2 kW high pressure mercury lamp at a distance of 50 cm over 2 minutes. The exposed PS plate was heated to 100° C. for 10 minutes and then developed by dipping it in DP-4 (trade name; available from Fuji Photo Film Co., Ltd.) diluted 8 times with water at 25° C. for 60 seconds. As a result, all of the PS plates provided clear positive images. The results obtained are summarized in Table 1.

TABLE 1

| Ex. No. | Light-Sensitive Solution | Alkali-Soluble Resin | Vinyl Ether Comp. | Acid-Generator | Step No. of Gray Scale |
|---|---|---|---|---|---|
| 1 | (A)-1 | Acrylic resin "Carboset XL-44" (available from Goodrich Company) | a-1 | 1-9 | 7 |
| 2 | (A)-2 | Acrylic resin "Carboset XL-44" (available from Goodrich Company) | a-3 | 1-9 | 7 |
| 3 | (A)-3 | Acrylic resin "Carboset XL-44" (available from Goodrich Company) | a-7 | 1-9 | 8 |
| 4 | (A)-4 | Acrylic resin "Carboset XL-44" (available from Goodrich Company) | a-9 | 1-9 | 7 |
| 5 | (A)-5 | Acrylic resin "Carboset XL-44" (available from Goodrich Company) | a-15 | 1-9 | 7 |
| 6 | (A)-6 | Phenol resin Resin M | a-7 | 1-9 | 6 |
| 7 | (A)-7 | Polymethyl acrylate | a-7 | 1-9 | 5 |
| 8 | (A)-8 | Novolak resin | a-7 | 1-9 | 5 |
| 9 | (A)-9 | Carboset XL-44 | a-7 | 1-7 | 5 |
| 10 | (A)-10 | " | a-7 | 1-15 | 9 |

EXAMPLES 11 to 15

Light-sensitive solutions (B)-11 to (B)-15 having the following formulations were prepared. Each light-sensitive solution was applied onto a silicon wafer of 2 mm thickness with a spin coater and dried on a hot plate maintained at 90° C. for 2 minutes. The thickness of the coated layer was adjusted to 1 μm (determined after drying).

| Light-Sensitive Solution: Formulation (B) | |
|---|---|
| Alkali-soluble resin listed in Table 2 | 0.2 g |
| Vinyl ether compound listed in Table 2 | 0.08 g |
| Photolytically acid-generating agent listed in Table 2 (acid generator) | 0.002 g |
| Dioxane | 3.0 g |
| Methanol | 1.5 g |

TABLE 2

| Ex. No. | Light-Sensitive Solution | Alkali-Soluble Resin Used | Vinyl Ether Compound | Acid-Generator |
|---|---|---|---|---|
| 11 | (B)-11 | Carboset XL-44 | a-1 | 1-9 |
| 12 | (B)-12 | " | a-7 | 1-9 |
| 13 | (B)-13 | Novolak resin | a-1 | 1-9 |
| 14 | (B)-14 | " | a-7 | 1-9 |
| 15 | (B)-15 | " | a-7 | 1-15 |

The resulting resist was imagewise exposed to light using a reduction-projection exposure machine (stepper) provided with a light source emitting a monochromatic light of 436 nm and then developed for 60 seconds by dipping in a 2.4% aqueous solution of tetramethylammonium hydroxide to give a resist pattern. All of the samples tested could provide good pattern having clear lines and spaces of 0.8 μm.

EXAMPLE 16

The resist of Example 12 was irradiated with an ultraviolet ray of 254 nm through a glass mask according to the contact exposure method and then developed in the same manner used in Example 12. As a result, there was obtained a good pattern having clear lines and spaces of 0.7 μm.

Comparative Examples 1 to 3

The same procedures used in Example 3 were repeated except that enol ether group-containing compounds listed in the following Table 3 were used instead of the vinyl ether compound (a-7) used in Example 3. As a result, positive images were obtained in every case, but the step numbers of the gray scale were significantly low as compared with those observed for the light-sensitive compositions of the present invention. The results obtained are listed in Table 3.

TABLE 3

| Com. Ex. | Enol Ether Group-containing Compound | Step No. of G.S. |
| --- | --- | --- |
| 1 | [structure: bis-chromene diether] | 2 |
| 2 | [structure: bis(α-methylstyryl) diether] | 1 |
| 3 | [structure: bis(dimethyl-dihydrochromene) diether] | 2 |

EXAMPLES 17 to 26

The same procedures used in Examples 1 to 10 were repeated to give aluminum plates.

Then 10 kinds of light-sensitive solutions (C)-1 to (C)-10 having the following formulations were prepared using compounds listed in the following Table 4. These light-sensitive solutions each was applied onto the anodized aluminum plate and then dried at 100° C. for 2 minutes to give each corresponding PS plate. The coated amount of each light-sensitive solution was adjusted to 1.5 g/m² (weighed after drying).

| Light-Sensitive Solution: Formulation (C) | |
| --- | --- |
| Alkali-soluble resin listed in Table 4 | 0.2 g |
| Vinyl ether compound listed in Table 4 | 0.08 g |
| Photolytically acid-generating agent listed in Table 4 (acid generator) | 0.002 g |
| Dioxane | 1.5 g |
| Methanol | 0.75 g |

A gray scale having a density difference of 0.15 was brought into close contact with the light-sensitive layer of the resulting PS plate and the resulting assembly was exposed to light from a 2 kW high pressure mercury lamp at a distance of 50 cm over 2 minutes. The exposed PS plate was heated to 100° C. for 10 minutes and then developed by dipping it in DP-4 (trade name; available from Fuji Photo Film Co., Ltd.) diluted 8 times with water at 25° C. for 60 seconds. As a result, all of the PS plates provided clear positive images, The results obtained are summarized in Table 4.

TABLE 4

| Ex. No. | Light-Sensitive Solution | Alkali-Soluble Resin | Vinyl Ether Comp. | Acid-Generator | Step No. of Gray Scale |
| --- | --- | --- | --- | --- | --- |
| 17 | (C)-1 | Acrylic resin "Carboset XL-44" (available from Goodrich Company) | VI-1 | 1-9 | 6 |
| 18 | (C)-2 | Acrylic resin "Carboset XL-44" (available from Goodrich Company) | VI-4 | 1-9 | 7 |
| 19 | (C)-3 | Acrylic resin "Carboset XL-44" (available from Goodrich Company) | VI-10 | 1-9 | 8 |
| 20 | (C)-4 | Acrylic resin "Carboset XL-44" (available from Goodrich Company) | VI-13 | 1-9 | 7 |
| 21 | (C)-5 | Acrylic resin "Carboset XL-44" (available from Goodrich Company) | VI-14 | 1-9 | 7 |
| 22 | (C)-6 | Phenol resin Resin M | VI-10 | 1-9 | 7 |
| 23 | (C)-7 | Polymethyl | VI-10 | 1-9 | 5 |

TABLE 4-continued

| Ex. No. | Light-Sensitive Solution | Alkali-Soluble Resin | Vinyl Ether Comp. | Acid-Generator | Step No. of Gray Scale |
|---|---|---|---|---|---|
|  |  | acrylate |  |  |  |
| 24 | (C)-8 | Novolak resin | VI-10 | 1-9 | 7 |
| 25 | (C)-9 | Carboset XL-44 | VI-10 | 1-7 | 5 |
| 26 | (C)-10 | " | VI-10 | 1-15 | 10 |

EXAMPLES 27 to 38

Light-sensitive solutions (D)-11 to (D)-22 having the following formulations were prepared, Each light-sensitive solution was applied onto a silicon wafer of 2 mm thickness with a spin coater and dried on a hot plate maintained at 90° C. for 2 minutes. The thickness of the coated layer was adjusted to 1 μm (determined after drying),

| Light-Sensitive Solution: Formulation (D) | |
|---|---|
| Alkali-soluble resin listed in Table 5 | 0.2 g |
| Vinyl ether compound listed in Table 5 | 0 08 g |
| Photolytically acid-generating agent listed in Table 5 (acid generator) | 0.002 g |
| Dioxane | 3.0 g |
| Methanol | 1.5 g |

TABLE 5

| Ex. No. | Light-Sensitive Solution | Alkali-Soluble Resin Used | Vinyl Ether Compound | Acid-Generator |
|---|---|---|---|---|
| 27 | (D)-11 | Carboset XL-44 | VI-1 | 1-9 |
| 28 | (D)-12 | " | VI-10 | 1-9 |
| 29 | (D)-13 | Novolak resin | VI-1 | 1-9 |
| 30 | (D)-14 | " | VI-10 | 1-9 |
| 31 | (D)-15 | " | VI-10 | 1-15 |
| 32 | (D)-16 | " | VI-22 | 1-9 |
| 33 | (D)-17 | " | VI-25 | 1-9 |
| 34 | (D)-18 | " | VI-27 | 1-9 |
| 35 | (D)-19 | " | VI-28 | 1-9 |
| 36 | (D)-20 | " | VI-31 | 1-9 |
| 37 | (D)-21 | " | VI-32 | 1-9 |
| 38 | (D)-22 | " | VI-35 | 1-9 |

The resulting resists each was imagewise exposed to light using a reduction-projection exposure machine (stepper) provided with a light source emitting monochromatic light of 436 nm and then developed for 60 seconds by dipping in a 2.4% aqueous solution of tetramethylammonium hydroxide to give a resist pattern. All of the samples tested could provide good pattern having clear lines and spaces of 0.8μm.

EXAMPLE 39

The resist of Example 28 was irradiated with an ultraviolet ray of 254 nm through a glass mask according to the contact exposure method and then developed in the same manner used in Example 28. As a result, there was obtained a good pattern having clear lines and spaces of 0.7 μm.

Comparative Examples 4 to 6

The same procedures used in Example 19 were repeated except that enol ether group-containing compounds listed in the following Table 6 were used instead of the vinyl ether compound (VI-10) used in Example 19. As a result, positive images were obtained in every case, but the step numbers of the gray scale were significantly low as compared with those observed for the light-sensitive compositions of the present invention. The results obtained are listed in Table 6.

TABLE 6

| Com. Ex. | Enol Ether Group-containing Compound | Step No. of G.S. |
|---|---|---|
| 1 | (benzofuran-based compound: O—CH₂CH₂—O—CH₂—CH₂—O bridged bis-benzofuran structure) | 2 |
| 2 | (α-methylstyrene-type enol ether: CH₃C(=C(H))-Ph linked by O—CH₂CH₂—O—CH₂—CH₂—O) | 1 |
| 3 | (dimethyl-dihydrobenzofuran based: H₃C,CH₃ substituted dihydrobenzofuran linked by O—CH₂CH₂—O—CH₂CH₂—O) | 2 |

As seen from the foregoing results, the positive-working light-sensitive composition of the present invention has high sensitivity and can provide clear posi-

What is claimed is:

1. A positive-working photosensitive composition whose solubility in an aqueous alkaline developer is increased by irradiation of an actinic light ray or a radiant ray, which composition comprises:
(a) a vinyl ether compound having at least one group represented by the following formula (A) bonded to an aromatic nucleus directly or through a connecting group selected from the group consisting of —CO—, —CONH— and —CH$_2$)$_p$ —NHCONH— where p is 1 or 2;

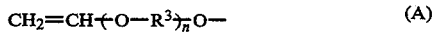  (A)

wherein R$^3$ represents a linear or branched alkylene group having 1 to 10 carbon atoms and n represents 0 or 1;
(b) a photolytically acid-generating agent capable of being decomposed by irradiation of an actinic light ray or a radiant ray and releasing an acid; and
(c) an aqueous alkaline solution-soluble polymer.

2. The positive-working photosensitive composition of claim 1 wherein the vinyl ether compound is a reaction product of an active hydrogen atom-containing vinyl ether compound and an isocyanate group-containing compound.

3. The positive-working photosensitive composition of claim 2 wherein the active hydrogen atom-containing vinyl ether compound is a compound represented by the following general formula (III), (IV) or (V):

  (III)

  (IV)

  (V)

wherein A represents a linear or branched alkylene group having 1 to 10 carbon atoms, and the isocyanate group-containing compound is selected from the group consisting of triphenylmethane triisocyanate, diphenylmethane diisocyanate, tolylene diisocyanate, dimers of 2,4-tolylene diisocyanate, naphthalene-1,5-diisocyanate, o-tolylene diisocyanate, polymethylene polyphenyl isocyanate, hexamethylene diisocyanate, adducts of tolylene diisocyanate with trimethylolpropane, adducts of hexamethylene diisocyanate with water and adducts of xylene diisocyanate with trimethylolpropane.

4. The positive-working photosensitive composition of claim 1 wherein the vinyl ether compound of the component (a) is selected from the group consisting of the following compounds (a-1) to (a-15):

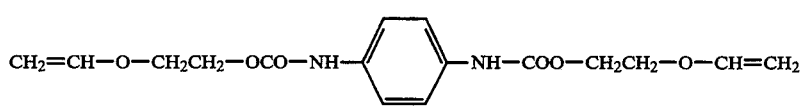 (a-1)

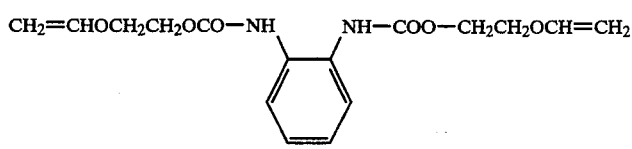 (a-2)

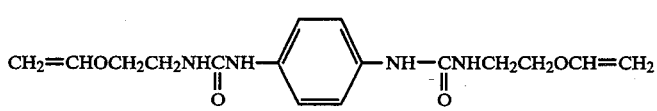 (a-3)

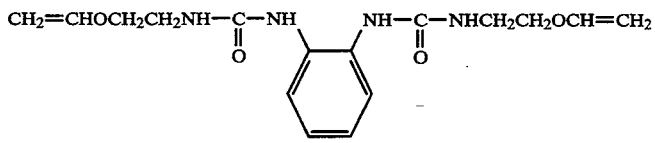 (a-4)

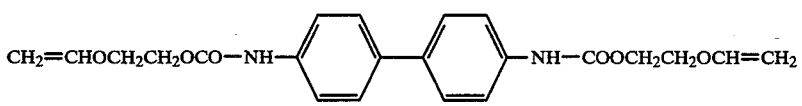 (a-5)

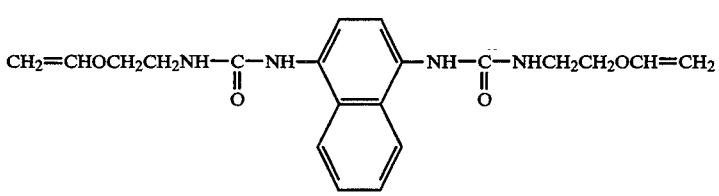 (a-6)

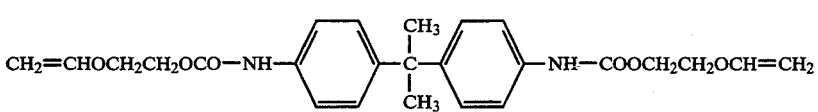 (a-7)

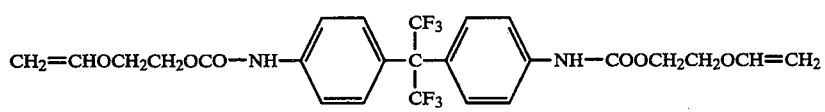
(a-8)

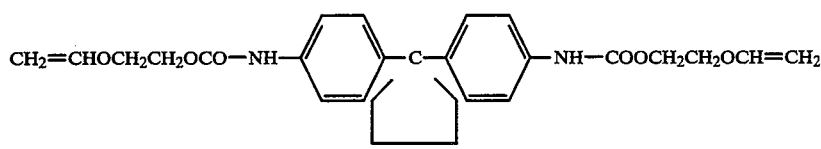
(a-9)

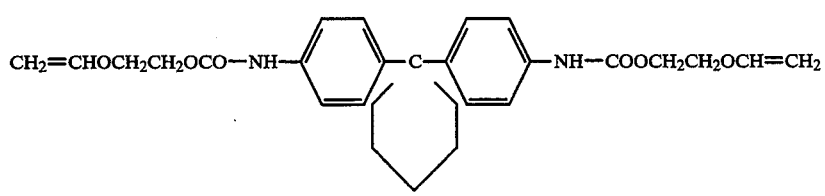
(a-10)

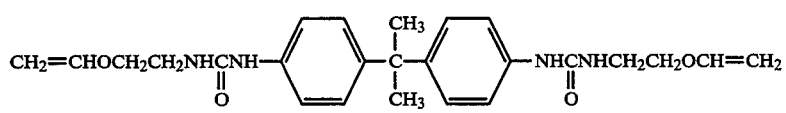
(a-11)

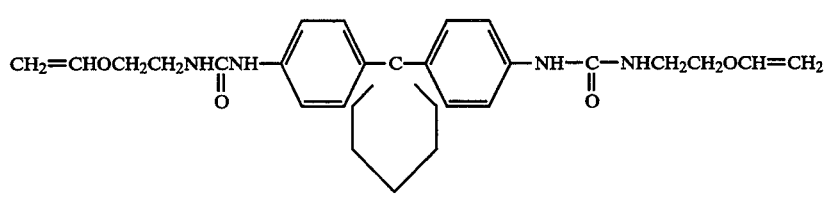
(a-12)

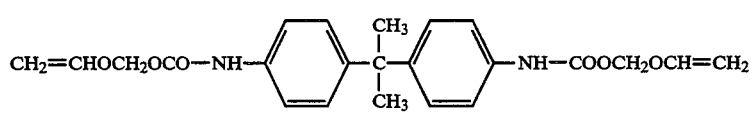
(a-13)

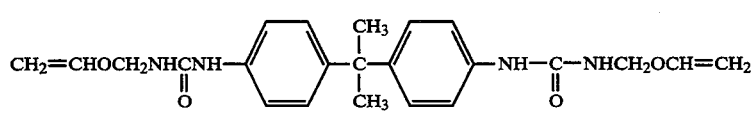
(a-14)

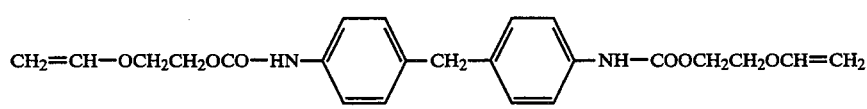
(a-15)

5. The positive-working photosensitive composition of claim 1 wherein the amount of the compound of the component (a) ranges from 5 to 50% by weight on the basis of the total weight of the solid contents of the composition.

6. The positive-working photosensitive composition of claim 1 wherein the compound of the component (b) is selected from the group consisting of iodonium and sulfonium salts represented by the following general formula (1) or (2) whose counterions are aromatic sulfonate residues:

$$\begin{array}{c} Ar^1 \\ \phantom{Ar^1}\diagdown \\ \phantom{Ar^1}\phantom{\diagdown}I^+X^- \\ \phantom{Ar^1}\diagup \\ Ar^2 \end{array} \quad (1)$$

$$\begin{array}{c} R^5 \\ \phantom{R^5}\diagdown \\ R^6{-}S^+X^- \\ \phantom{R^5}\diagup \\ R^7 \end{array} \quad (2)$$

wherein $Ar^1$ and $Ar^2$ may be the same or different and each represents an unsubstituted aryl group or an aryl group substituted with one or more groups selected from the group consisting of alkyl groups having 1 to 8 carbon atoms, alkoxy groups having 1 to 8 carbon atoms, nitro group and chlorine atom; $R^5$, $R^6$ and $R^7$ may be the same or different and each represents an aryl group having 6 to 14 carbon atoms which may be substituted with one or more groups selected from the group consisting of alkyl groups having 1 to 8 carbon atoms, alkoxy groups having 1 to 8 carbon atoms, nitro group, carboxyl group, hydroxyl group and halogen atoms, or an alkyl group having 1 to 8 carbon atoms which may be substituted with one or more groups selected from the group consisting of alkoxy groups having 1 to 8 carbon atoms, carboxyl group and alkoxycarbonyl groups; and X⁻ represents an anion selected from the group consisting of anions of halogen atoms, $BF_4^-$, $BCl_4^-$, $ZrCl_5^-$, $SbCl_6^-$, $FeCl_4^-$, $GaCl_4^-$, $GaBr_4^-$, $AlI_4^-$, $AlCl_4^-$, $SbF_6^-$, $CF_3SO_3^-$, $PF_6^-$, $BPh_4^-$ (Ph: phenyl group), naphthalene-1-sulfonate an ion, anthracene-1-sulfonate anion, anthraquinonesulfonate anion, anthracenesulfonate anion and anions derived from sulfonate residue-containing dyes.

7. The positive-working photosensitive composition of claim 1 wherein the compound of the component (b) is selected from the group consisting of the following compounds (1-1) to (1—15) and (2-1) to (2-12):

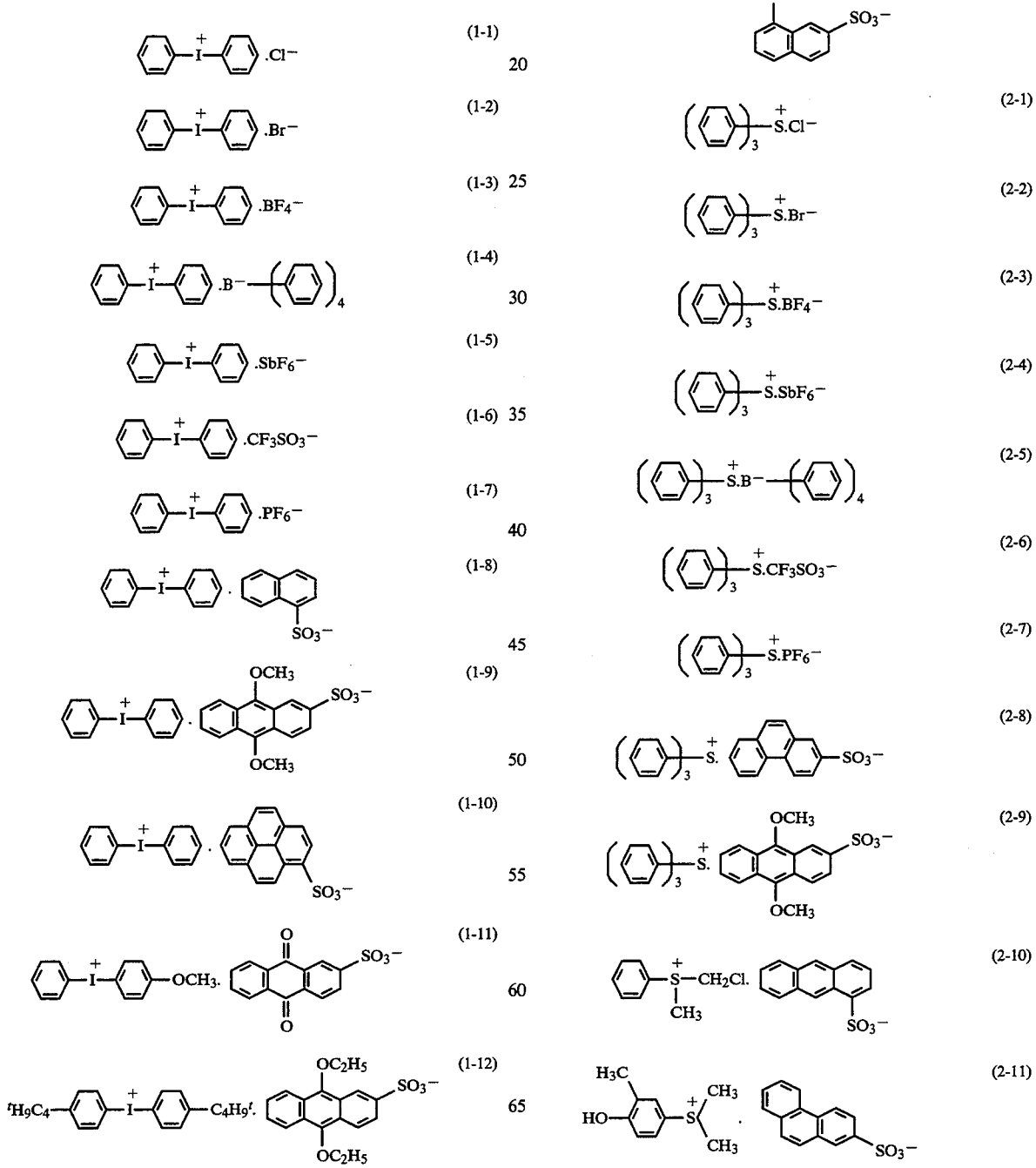

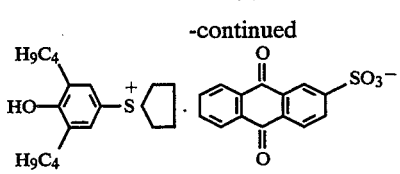

(2-12)

8. The positive-working photosensitive composition of claim 1 wherein the amount of the onium compound of the component (b) ranges from 0.1 to 20 parts by weight per 100 parts by weight of the vinyl ether compound of the component (a) used.

9. The positive-working photosensitive composition of claim 1 wherein the alkali-soluble polymer of the component (c) is at least one member selected from the group consisting of phenol/formaldehyde resin, o-cresol/formaldehyde resin, m-cresol/formaldehyde resin, p-cresol/formaldehyde resin, xylenol/formaldehyde resin, co-condensates thereof; combinations of condensates of phenol or cresol substituted with an alkyl group having 3 to 8 carbon atoms with formaldehyde and the foregoing phenol resins; polymers comprising copolymerized units derived from phenolic hydroxyl group-containing monomers; homopolymers and copolymers of p-hydroxystyrene, o-hydroxystyrene, m-isopropenylphenol and p-isopropenylphenol, these polymers which are partially etherified or esterified; polymers comprising copolymerized units derived from carboxyl group-containing monomers; carboxyl group-containing polyvinyl acetal resins; carboxyl group-containing polyurethane resins; polymers comprising copolymerized units derived from N-(4-sulfamoylphenyl)methacrylamide, N-phenylsulfonyl methacrylamide and maleimide; and active methylene group-containing polymers.

10. The positive-working photosensitive composition of claim 1 wherein the amount of the alkali-soluble polymer of the component (c) ranges from 30 to 80% by weight on the basis of the total weight of the solid contents of the composition.

11. The positive-working photosensitive composition of claim 1 wherein the vinyl ether compound of the component (a) is selected from those compounds represented by the following formulae (I) or (II).

$$R^1[-O-(R^3-O)_n-CH=CH_2]_m \quad (I)$$

$$R^2[-CO-O-R^3-O-CH=CH_2]_m \quad (II)$$

wherein $R^1$ and $R^2$ each represents an m-valent aromatic group; $R^3$ represents a linear or branched alkylene group having 1 to 10 carbon atoms; n is 0 or 1 and m is an integer of from 2 to 6.

12. The positive-working photosensitive composition of claim 11 wherein the vinyl ether compound of the component (a) is selected from those compounds represented by the following formula (VI):

$$R^8[-O-(R^3-O)_n-CH=CH_2]_m \quad (VI)$$

wherein $R^4$ represents an m-valent carbocyclic or heterocyclic aromatic group; $R^3$ represents a linear or branched alkylene group having 1 to 10 carbon atom; n is 0 or 1 and m is an integer of from 2 to 6.

13. The positive-working photosensitive composition of claim 11 wherein the vinyl ether compound of the component (a) is selected from the group consisting of ethylene glycol divinyl ether, triethylene glycol divinyl ether, 1,3-butanediol divinyl ether, tetramethylene glycol divinyl ether, neopentyl glycol divinyl ether, trimethylolpropane trivinyl ether, trimethylolethane trivinyl ether, hexanediol divinyl ether, 1,4-cyclohexanediol divinyl ether, tetraethylene glycol divinyl ether, pentaerythritol divinyl ether, pentaerythritol trivinyl ether, pentaerythritol tetravinyl ether, sorbitol tetravinyl ether, sorbitol pentavinyl ether, ethylene glycol diethylene vinyl ether, triethylene glycol diethylene vinyl ether, ethylene glycol dipropylene vinyl ether, triethylene glycol diethylene vinyl ether, trimethylolpropane triethylene vinyl ether, trimethylolpropane diethylene vinyl ether, pentaerythritol diethylene vinyl ether, pentaerythritol triethylene vinyl ether, pentaerythritol tetraethylene vinyl ether, reaction product of bisphenol A with chloromethyl vinyl ether, reaction product of bisphenol A with chloroethyl vinyl ether, reaction product of bisphenol A with acetylene, reaction product of hydroquinone with chloromethyl vinyl ether, reaction product of hydroquinone with chloroethyl vinyl ether, reaction product of hydroquinone with acetylene, reaction product of catechol with chloromethyl vinyl ether, reaction product of catechol with chloroethyl vinyl ether, terephthalic acid diethylene vinyl ether, phthalic acid diethylene vinyl ether, isophthalic acid diethylene vinyl ether, phthalic acid dipropylene vinyl ether, terephthalic acid dipropylene vinyl ether, isophthalic acid dipropylene vinyl ether, maleic acid diethylene vinyl ether, fumaric acid diethylene vinyl ether and itaconic acid diethylene vinyl ether.

14. The positive-working photosensitive composition of claim 11 wherein the vinyl ether compound of the component (a) is selected from the group consisting of the following compounds (VI-1) to (VI-41):

(VI-1)

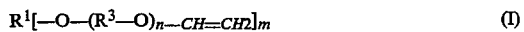

(VI-2)

(VI-3)

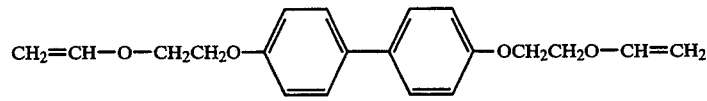

(VI-4)

-continued
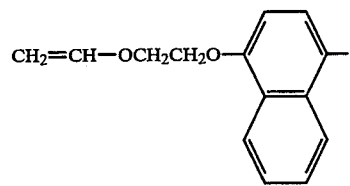 (VI-5)
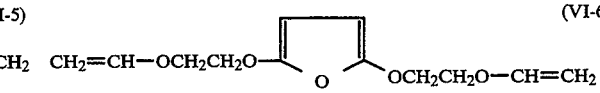 (VI-6)
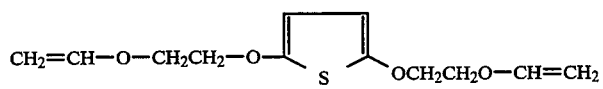 (VI-7)
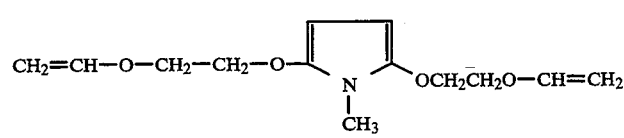 (VI-8)
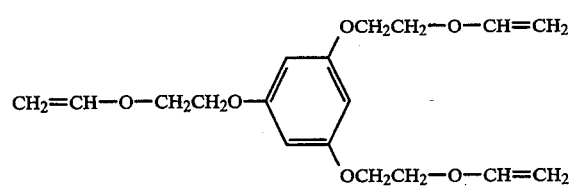 (VI-9)
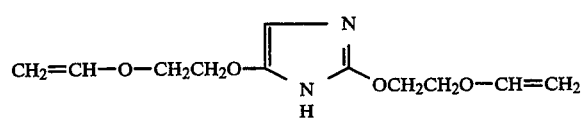 (VI-10)
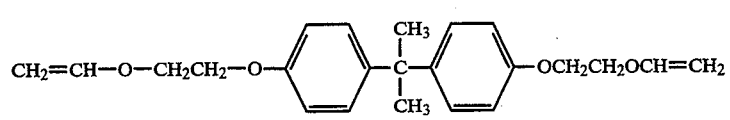 (VI-11)
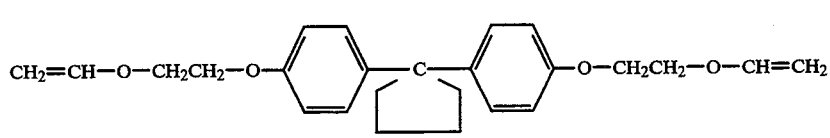 (VI-12)
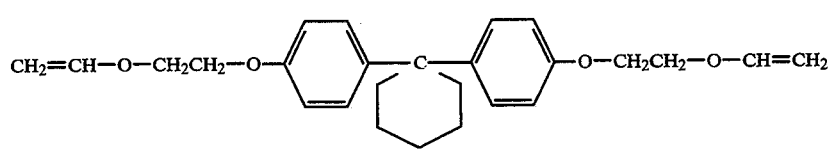 (VI-13)
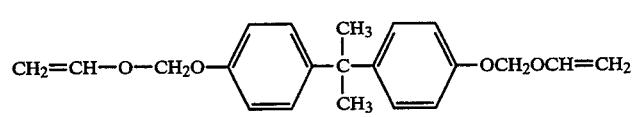 (VI-14)
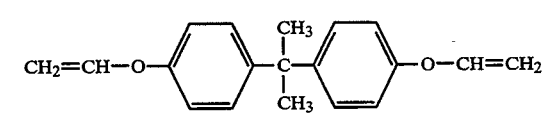 (VI-15)
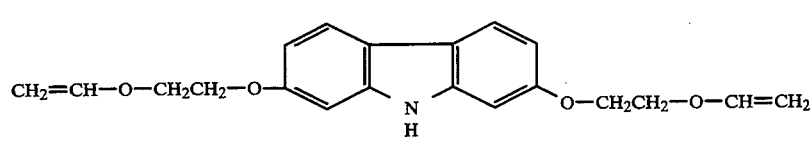 (VI-16)

-continued
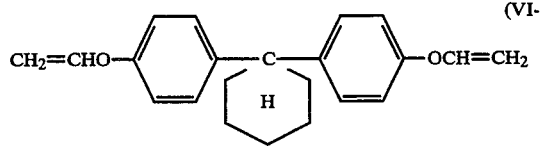 (VI-17)
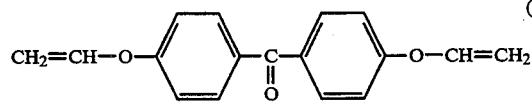 (VI-18)
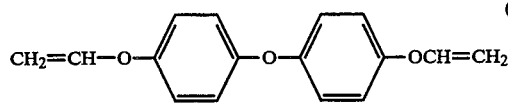 (VI-19)
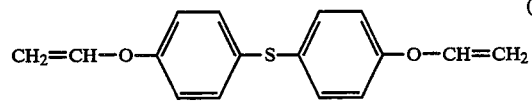 (VI-20)
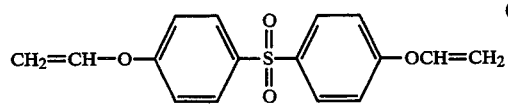 (VI-21)
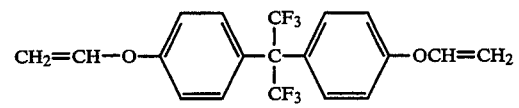 (VI-22)
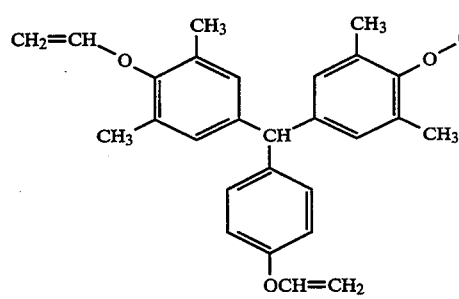 (VI-23)
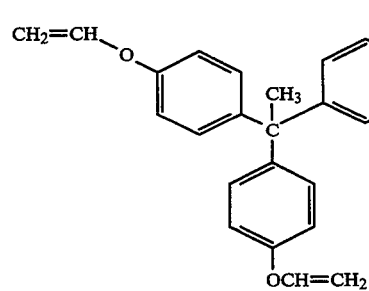 (VI-24)
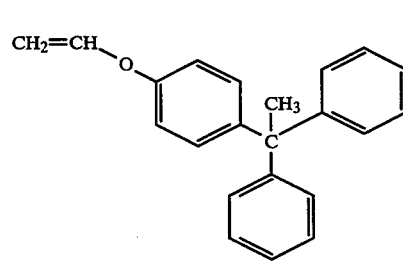 (VI-25)
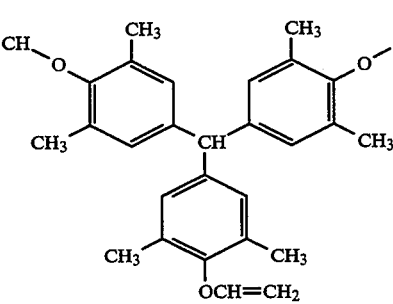 (VI-26)
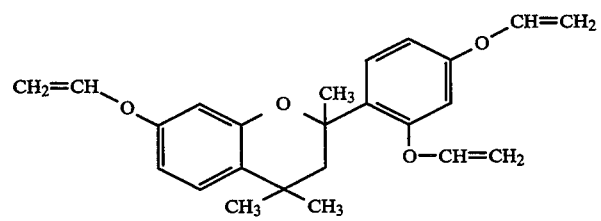 (VI-27)
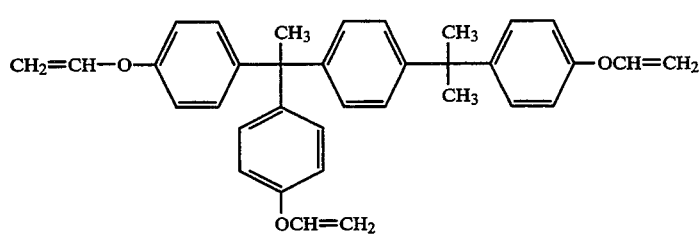 (VI-28)

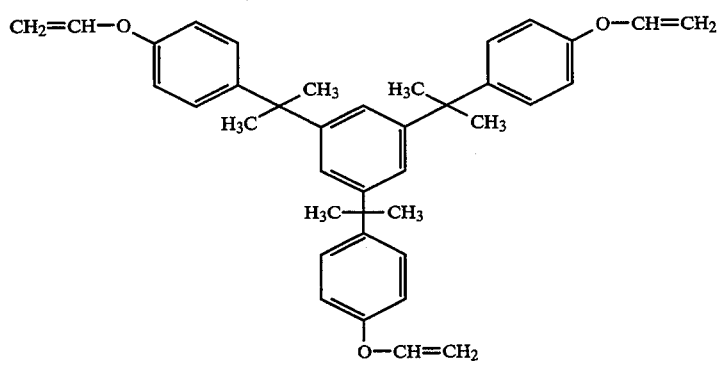
(VI-29)
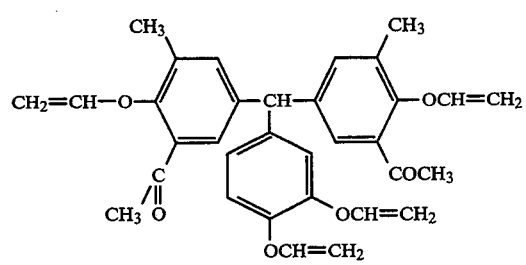
(VI-30)
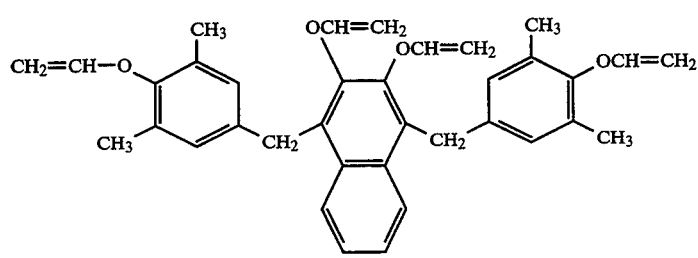
(VI-31)
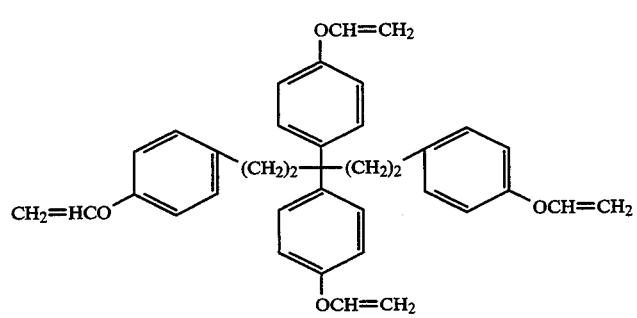
(VI-32)
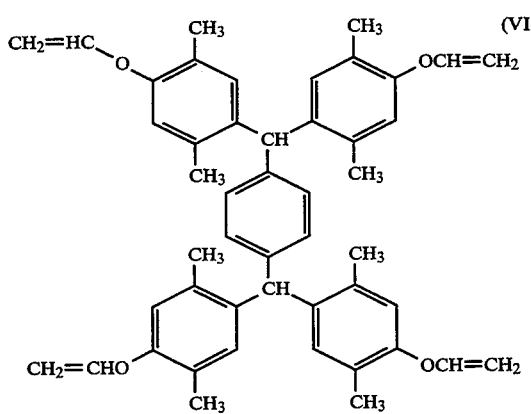
(VI-33)
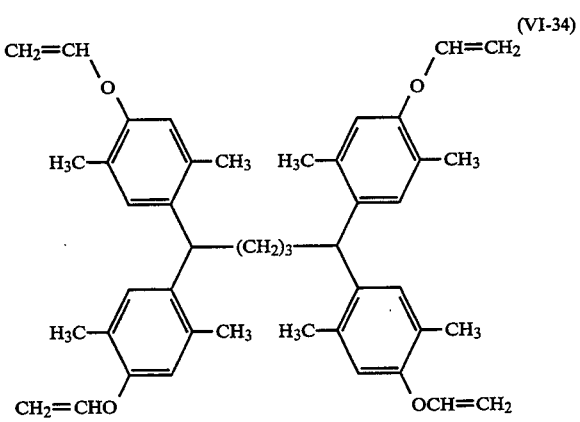
(VI-34)

-continued
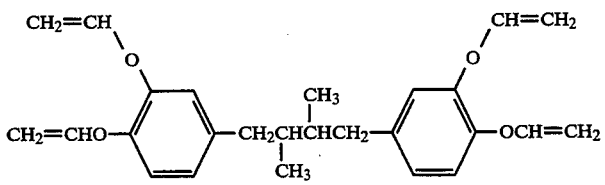 (VI-35)
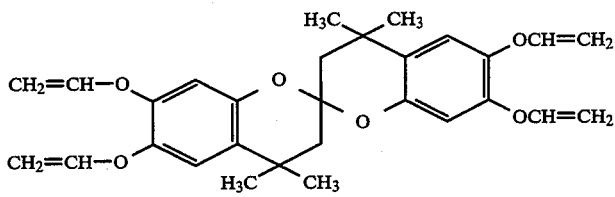 (VI-36)
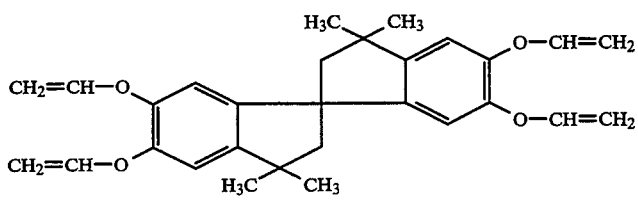 (VI-37)
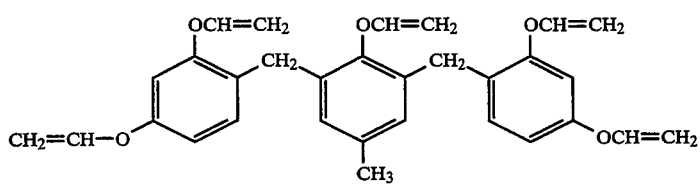 (VI-38)
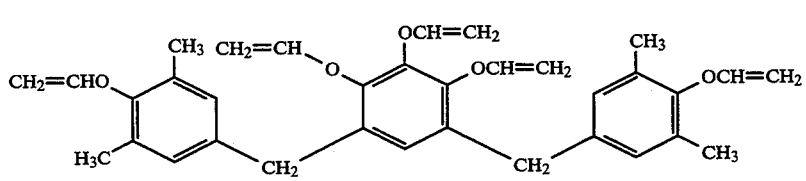 (VI-39)
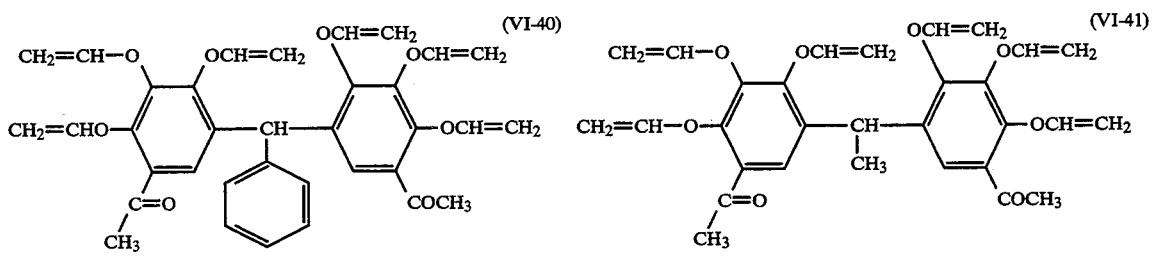 (VI-40) (VI-41)
15. The positive-working photosensitive composition according to claim 1, wherein said aromatic nucleus is selected from:
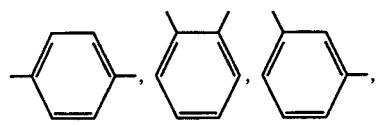
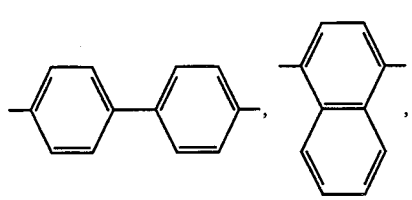
-continued
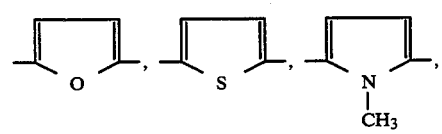
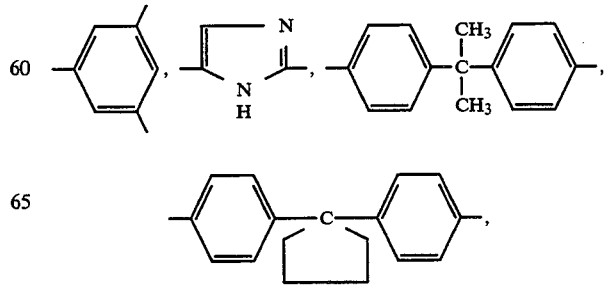

-continued
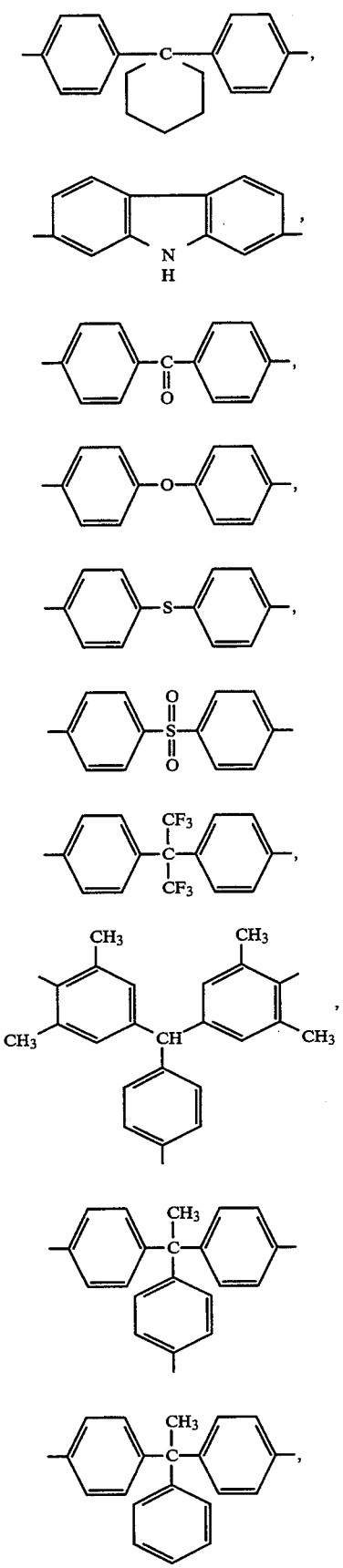
-continued
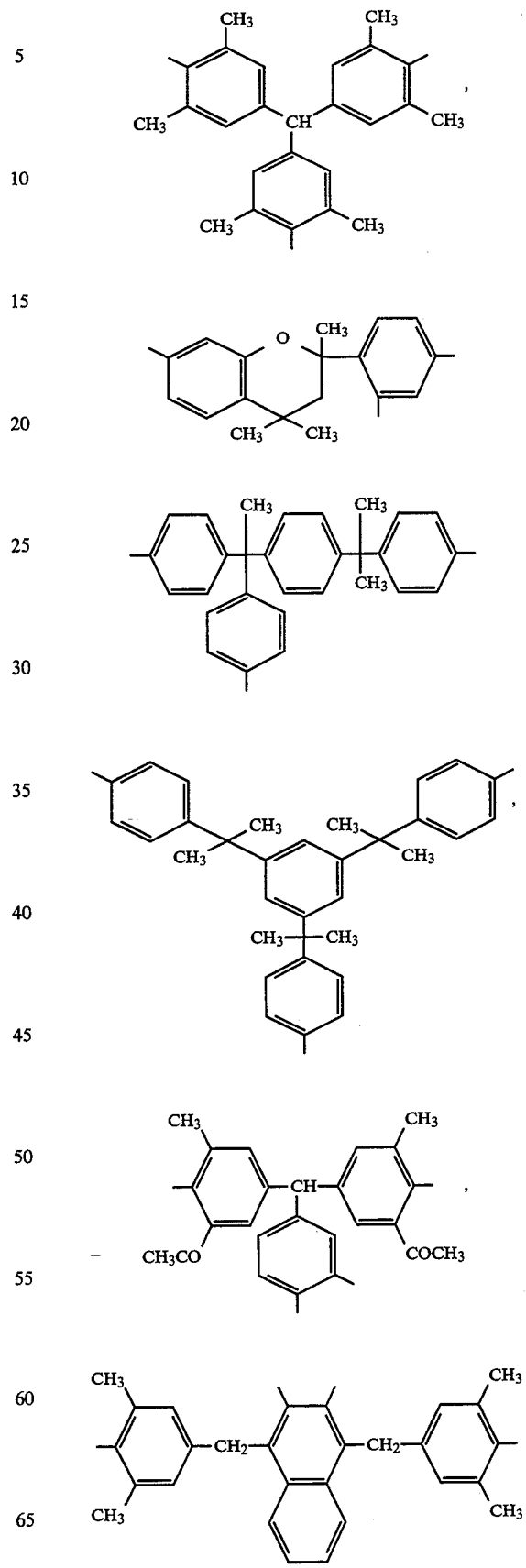

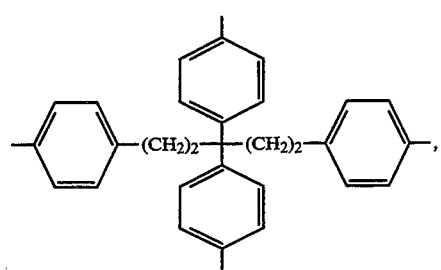
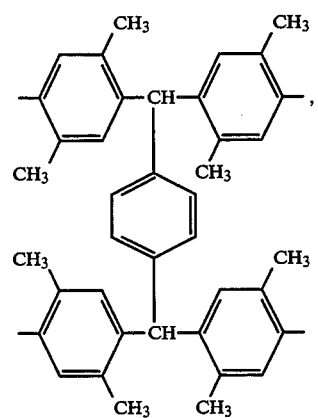
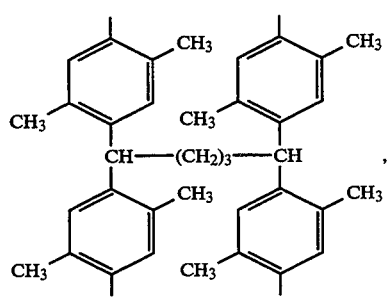
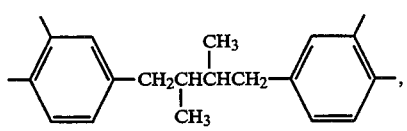
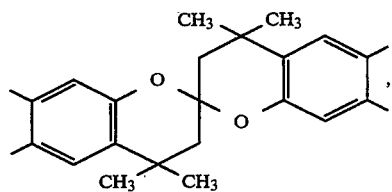
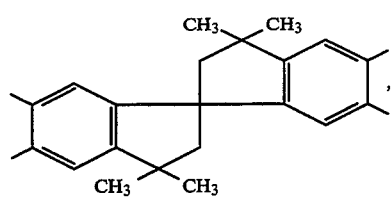
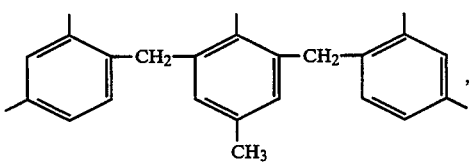
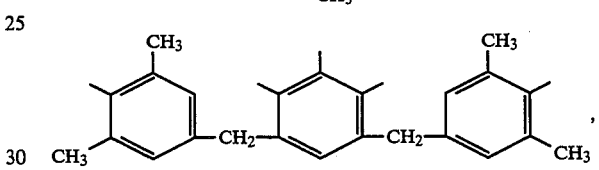
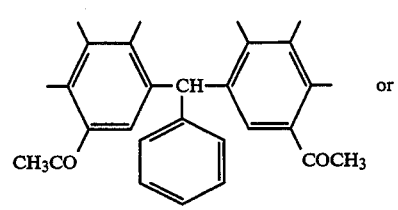
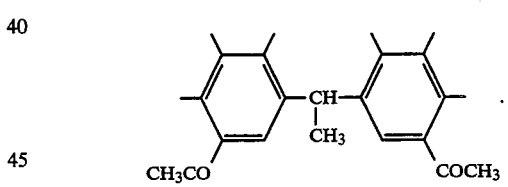
* * * * *